United States Patent
Yang et al.

(10) Patent No.: US 12,477,772 B2
(45) Date of Patent: Nov. 18, 2025

(54) METHOD FOR FORMING MULTI-GATE SEMICONDUCTOR STRUCTURE

(71) Applicant: TAIWAN SEMICONDUCTOR MANUFACTURING COMPANY LTD., Hsinchu (TW)

(72) Inventors: Chun-Ming Yang, Taipei (TW); Yu-Jiun Peng, Hsinchu (TW); Yu-Wen Wang, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 720 days.

(21) Appl. No.: 17/808,998

(22) Filed: Jun. 26, 2022

(65) Prior Publication Data
US 2023/0420567 A1    Dec. 28, 2023

(51) Int. Cl.
*H10D 30/62* (2025.01)
*H10D 30/01* (2025.01)
*H10D 30/60* (2025.01)
*H10D 84/01* (2025.01)
*H10D 84/03* (2025.01)

(52) U.S. Cl.
CPC ..... *H10D 30/6215* (2025.01); *H10D 30/0245* (2025.01); *H10D 30/611* (2025.01); *H10D 84/0158* (2025.01); *H10D 84/038* (2025.01)

(58) Field of Classification Search
CPC . H10D 30/43–435; H10D 62/119–123; H10D 30/014; H10D 30/47; H10D 30/481–485; H10D 30/6757; Y10S 977/938
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2015/0084041 A1* | 3/2015 | Hur | H10D 30/611 257/43 |
| 2017/0256615 A1* | 9/2017 | Chen | H10D 30/751 |
| 2019/0393350 A1* | 12/2019 | Thompson | H10D 30/014 |

* cited by examiner

*Primary Examiner* — Christine S. Kim
*Assistant Examiner* — Cole Leon Lindsey
(74) *Attorney, Agent, or Firm* — WPAT LAW; Anthony King

(57) ABSTRACT

A method for forming a multi-gate semiconductor structure is provided. A substrate including a fin structure is received. First portions of the fin structure are removed to expose a source/drain region of the fin structure. A semiconductor layer is formed in the source/drain region. Second portions of the fin structure are removed to expose a channel region of the fin structure. A surface of the channel region of the fin structure is cleaned. An interfacial layer is formed over the cleaned surface of the channel region of the fin structure.

20 Claims, 27 Drawing Sheets

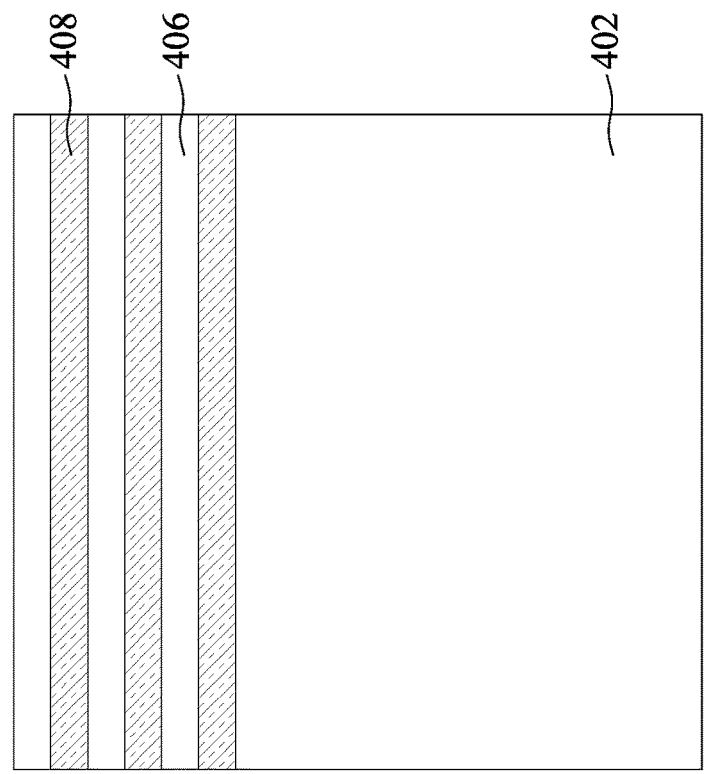
FIG. 5B

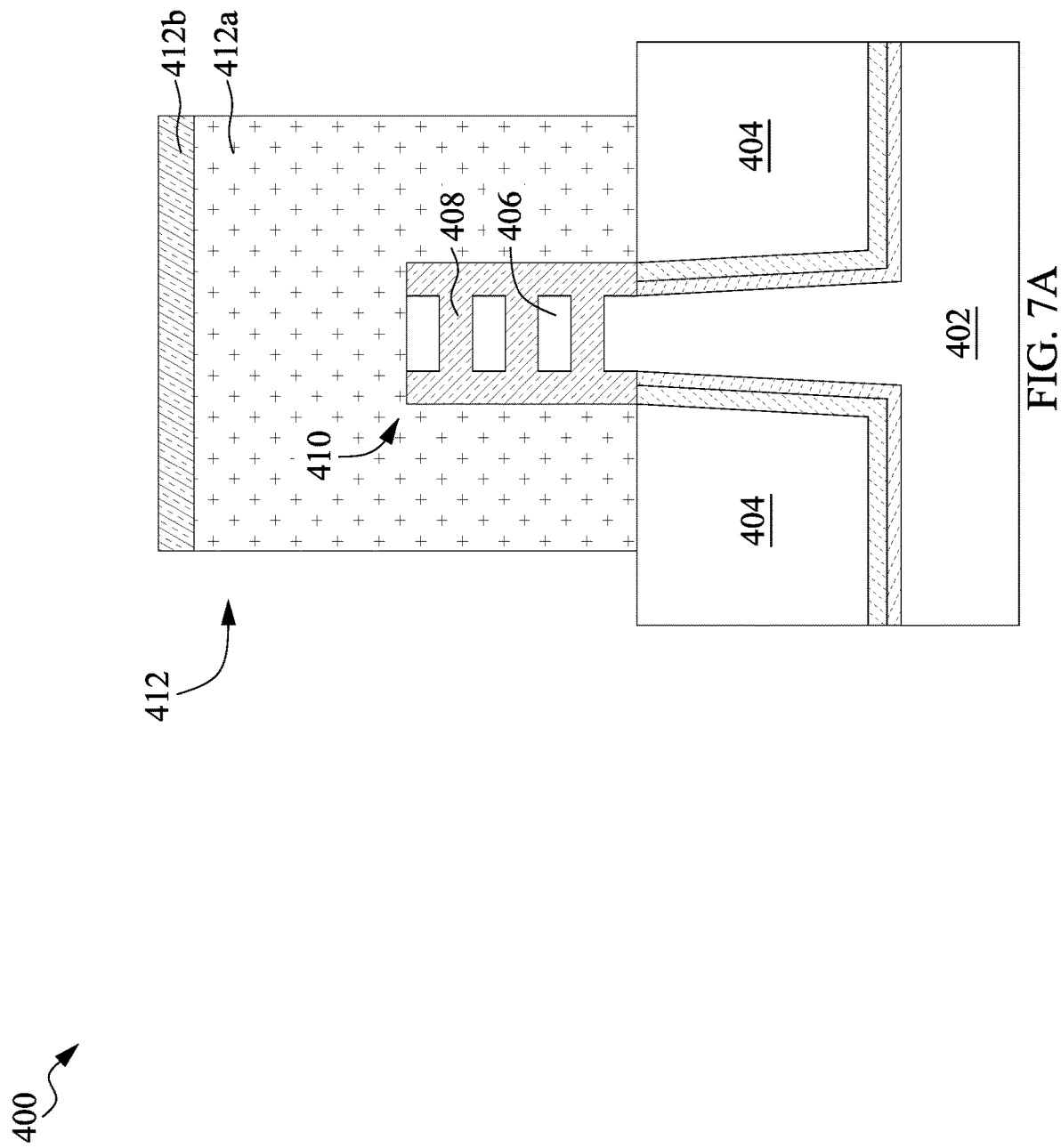

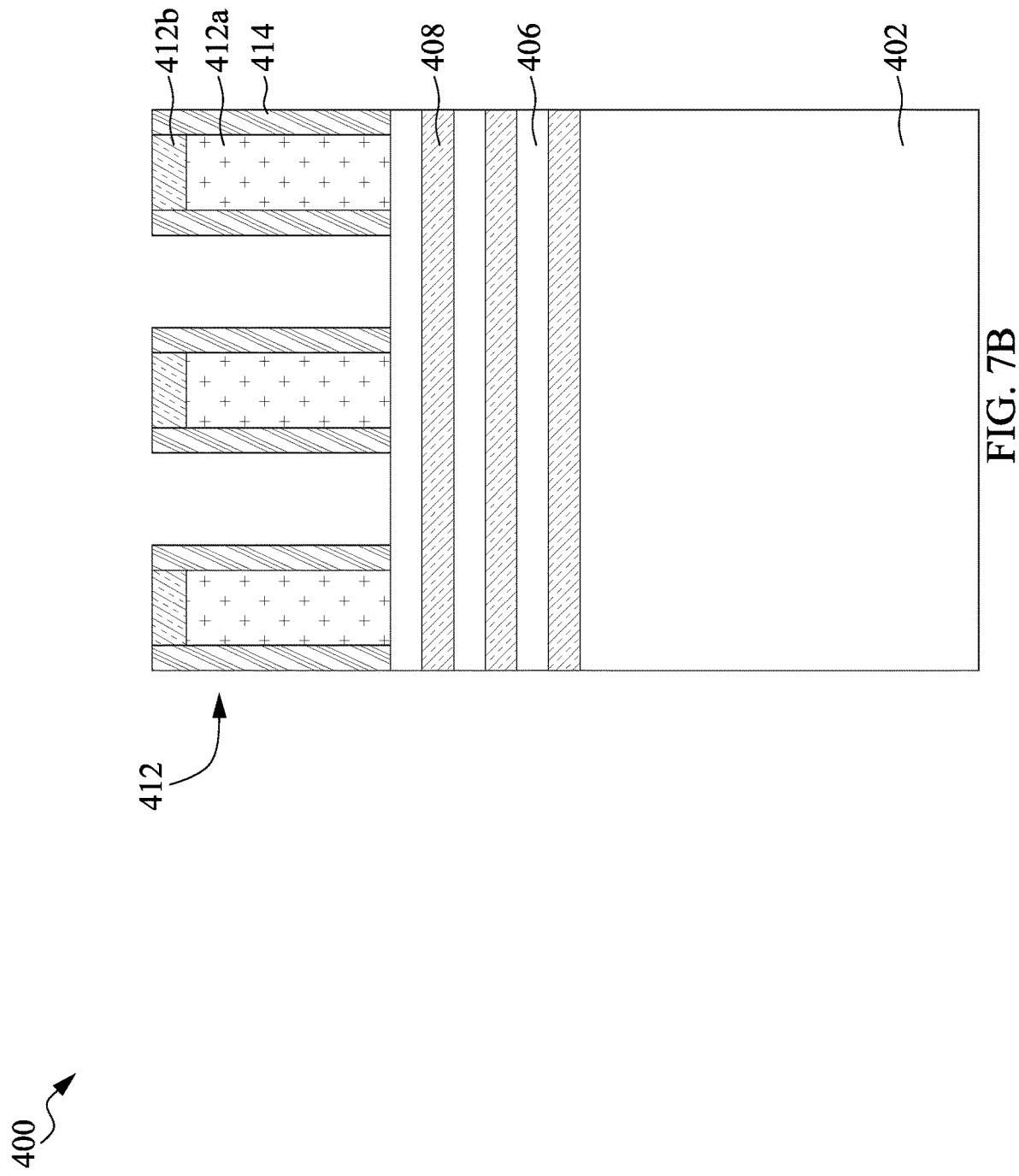

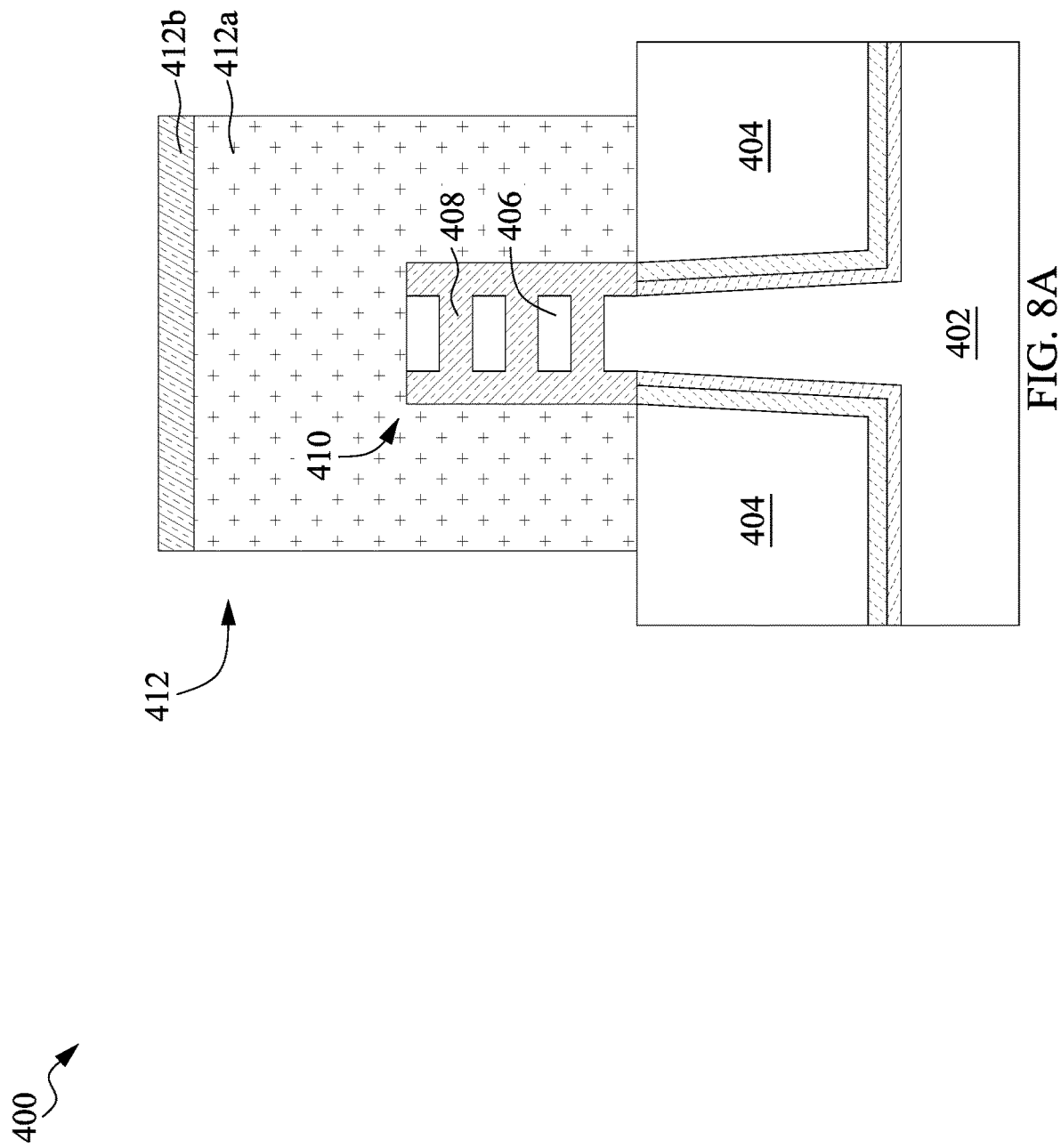

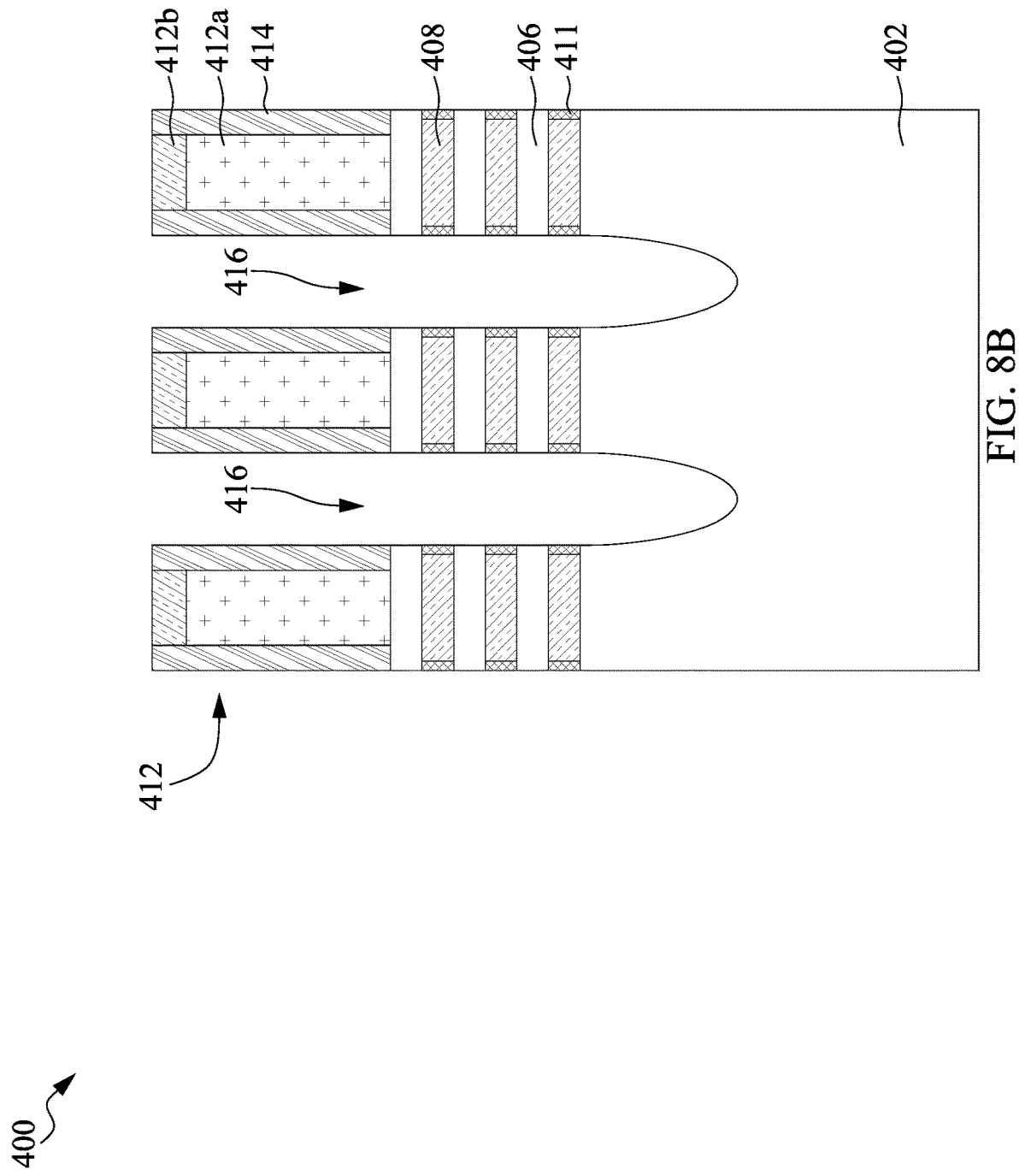

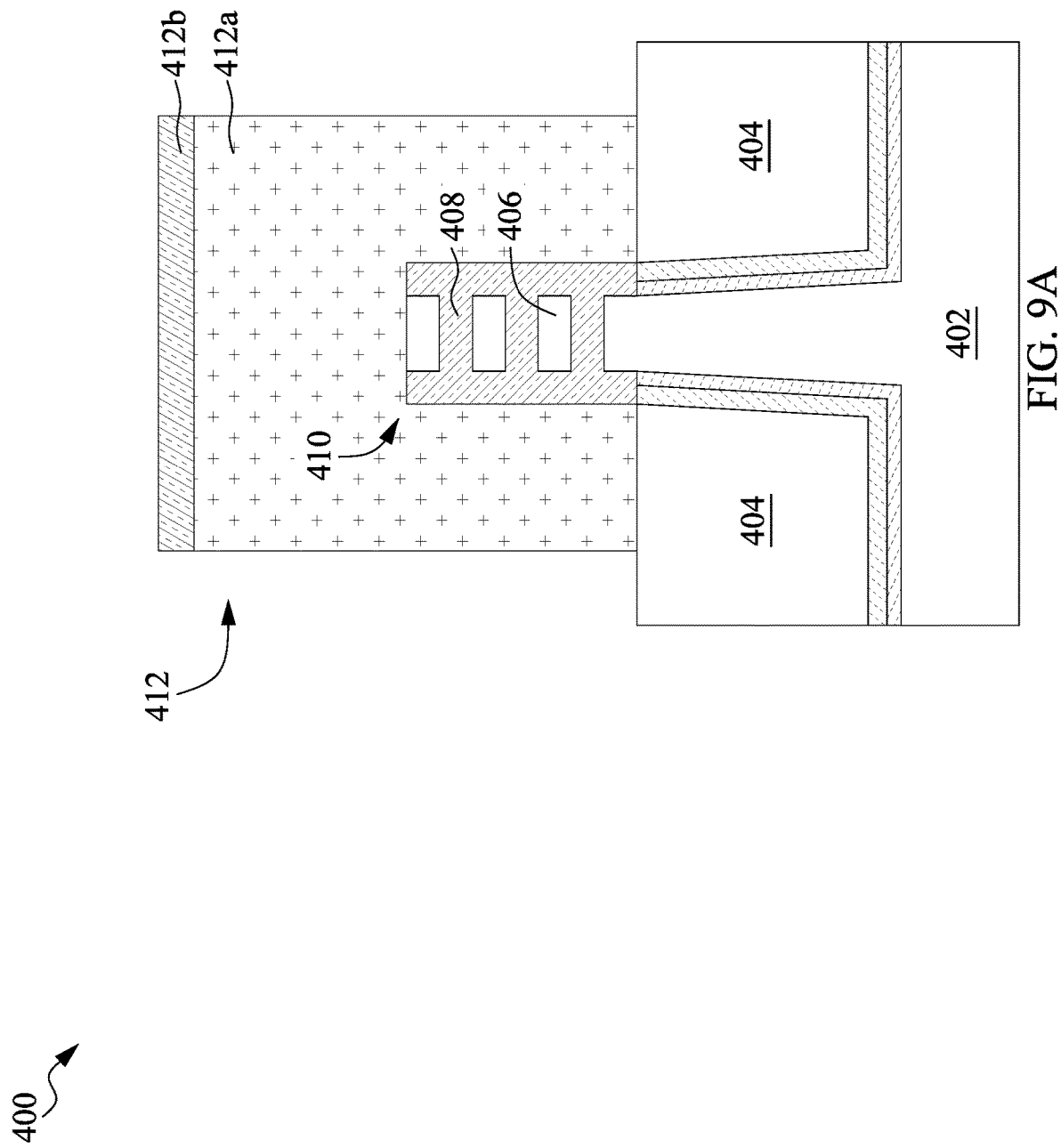

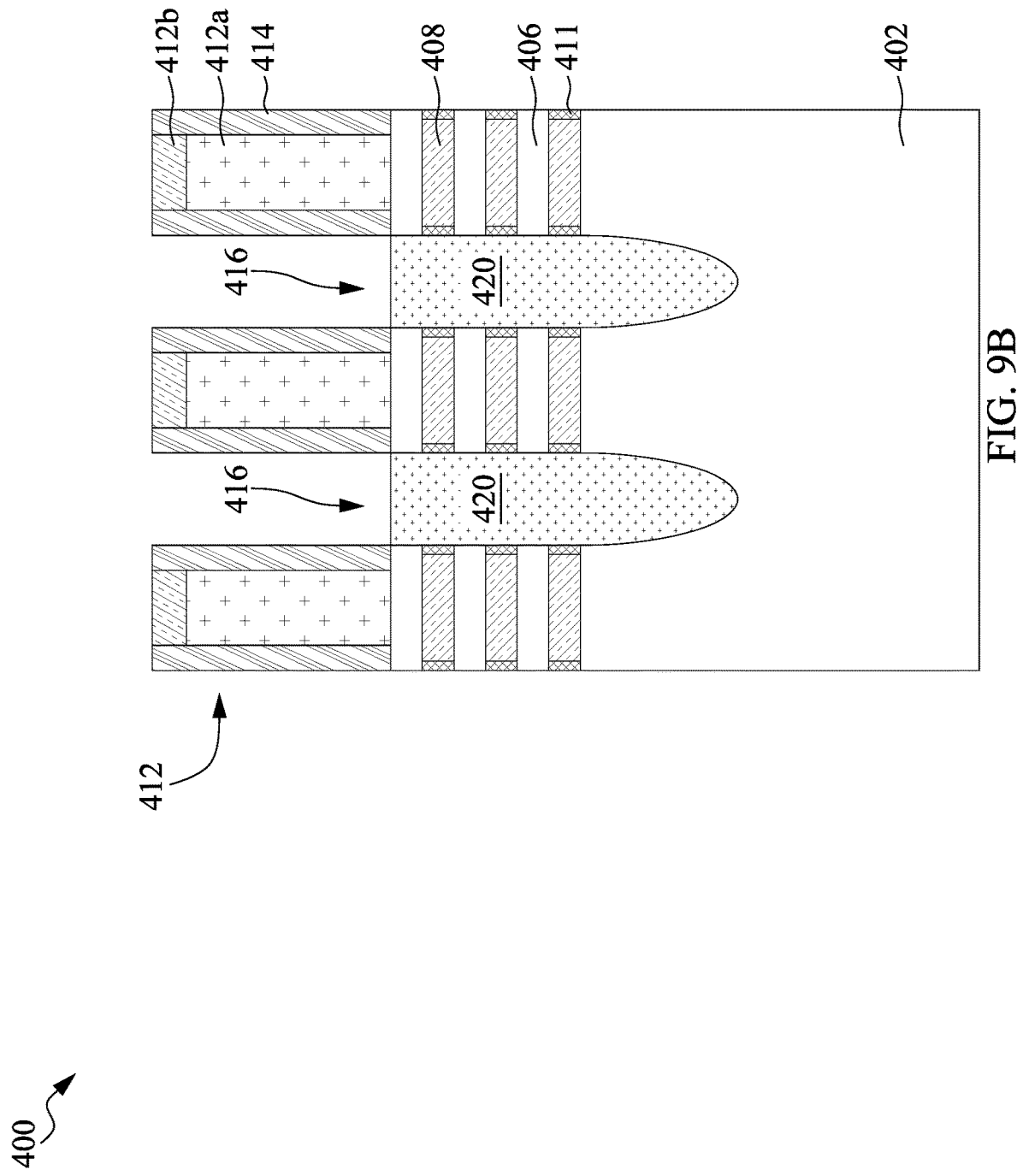

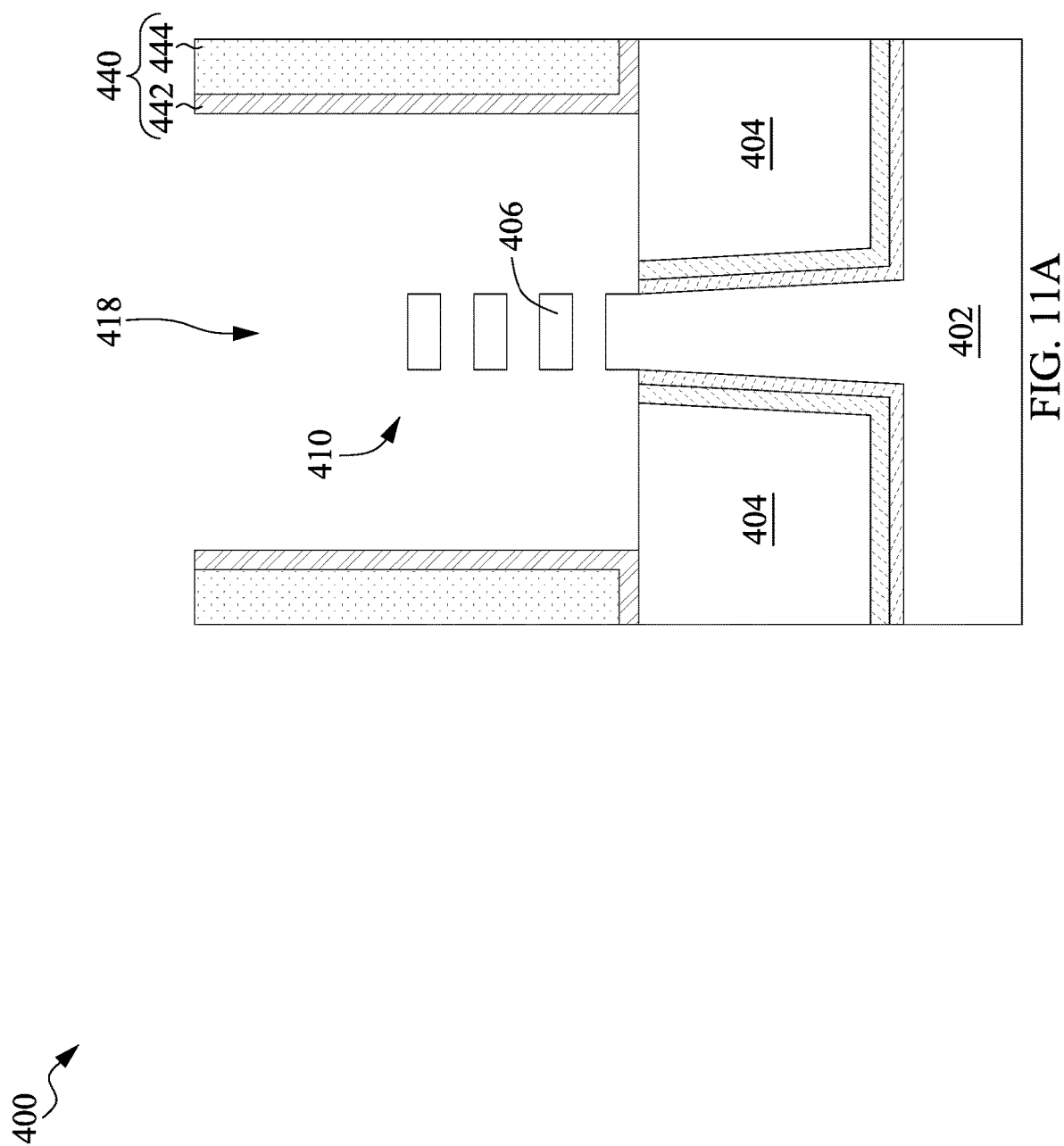

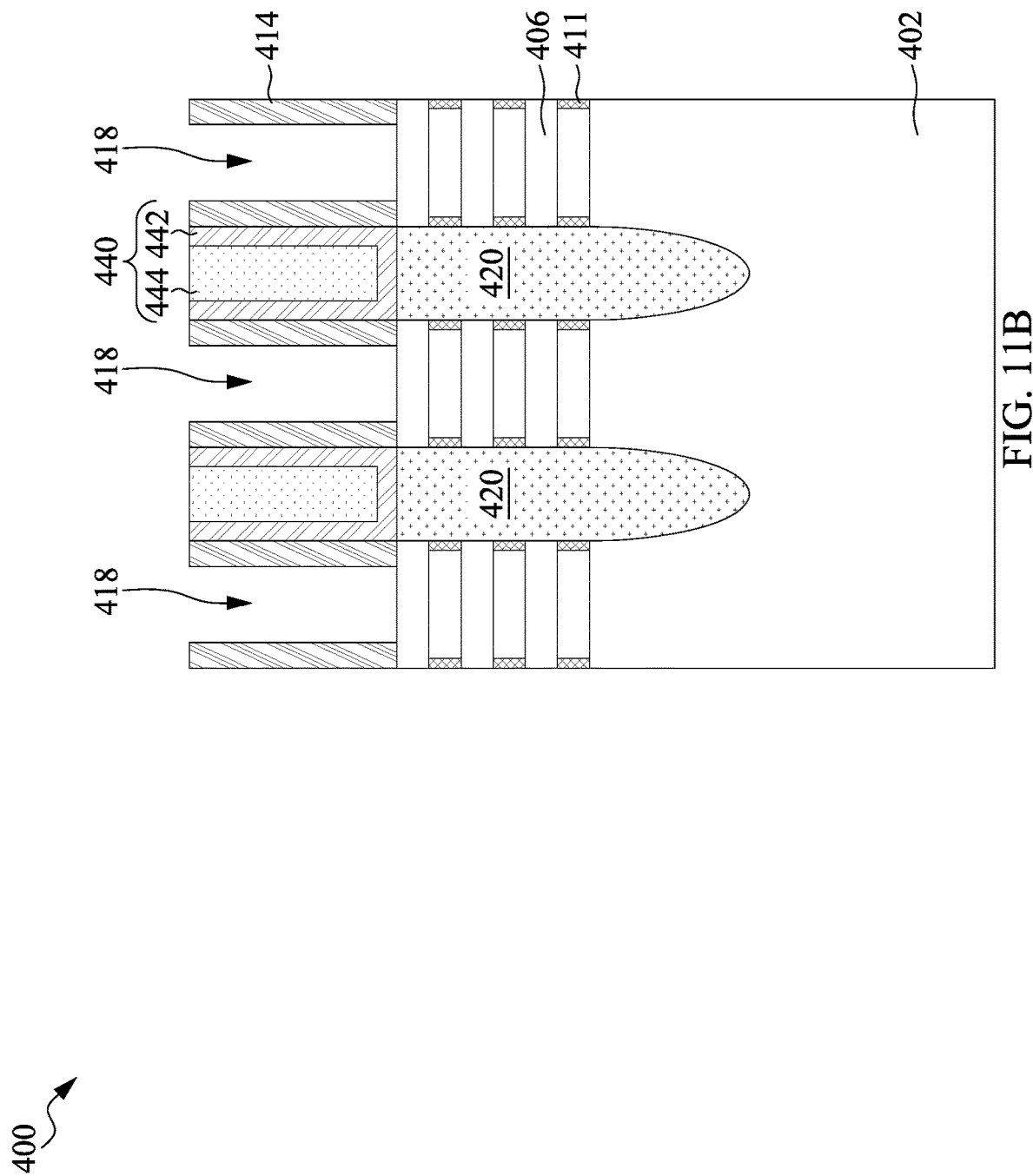

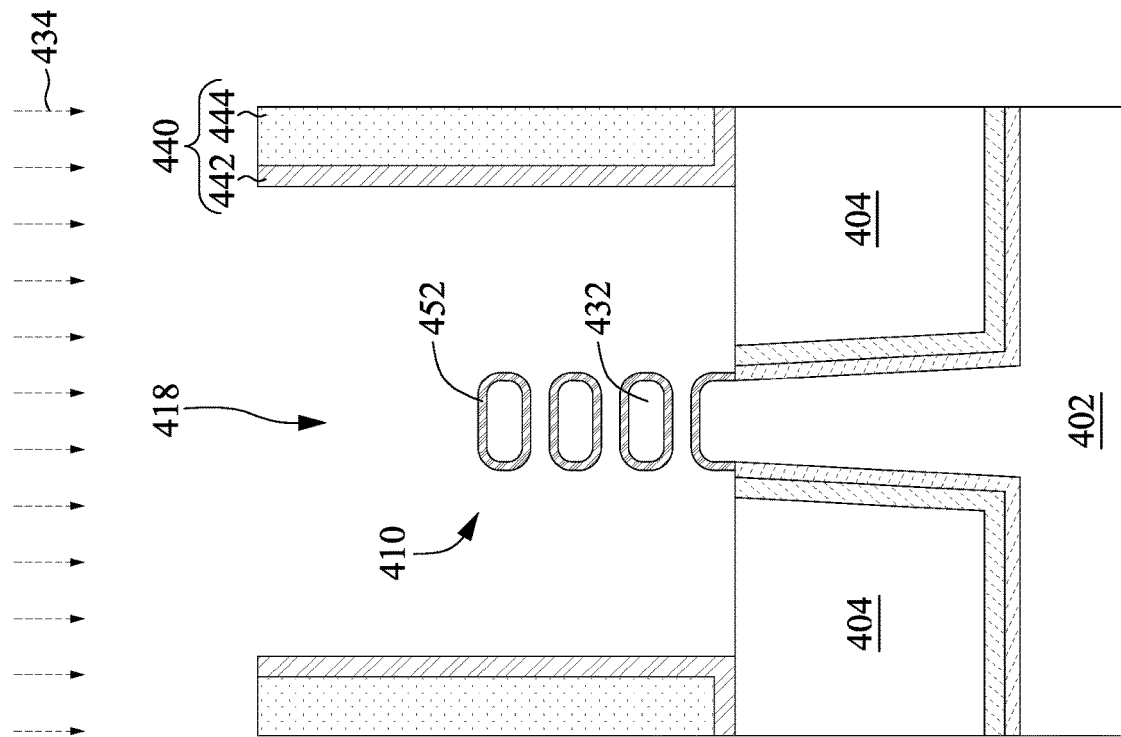

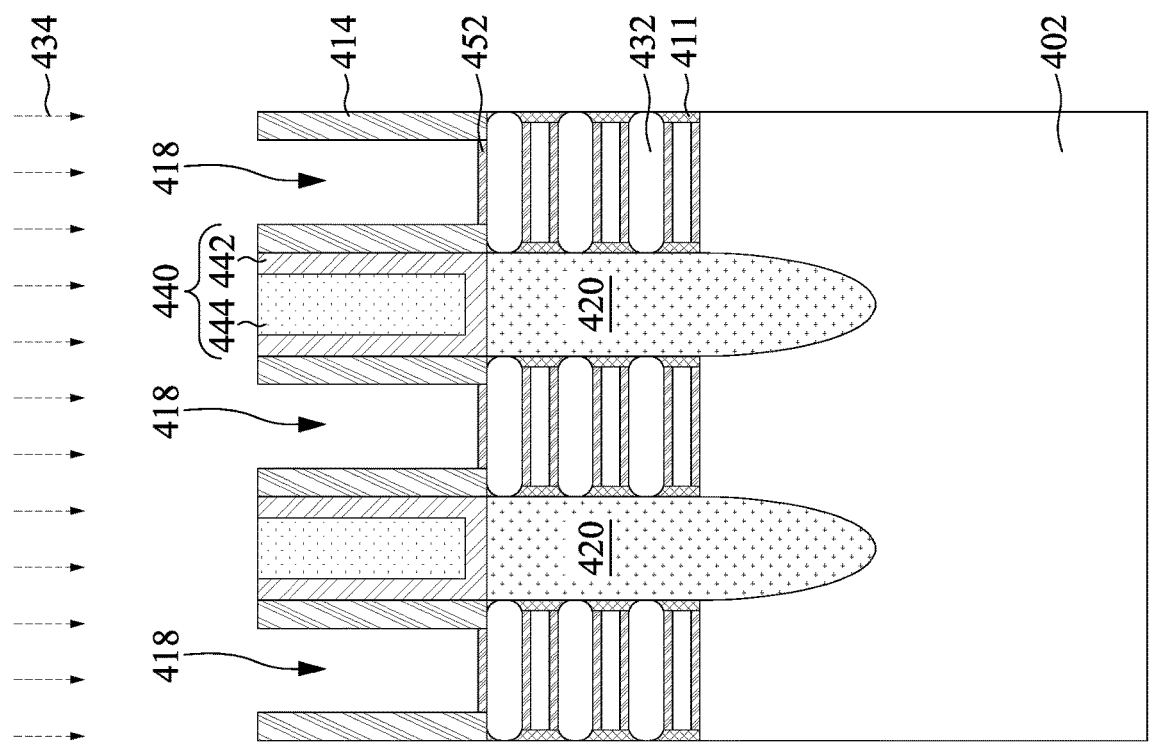

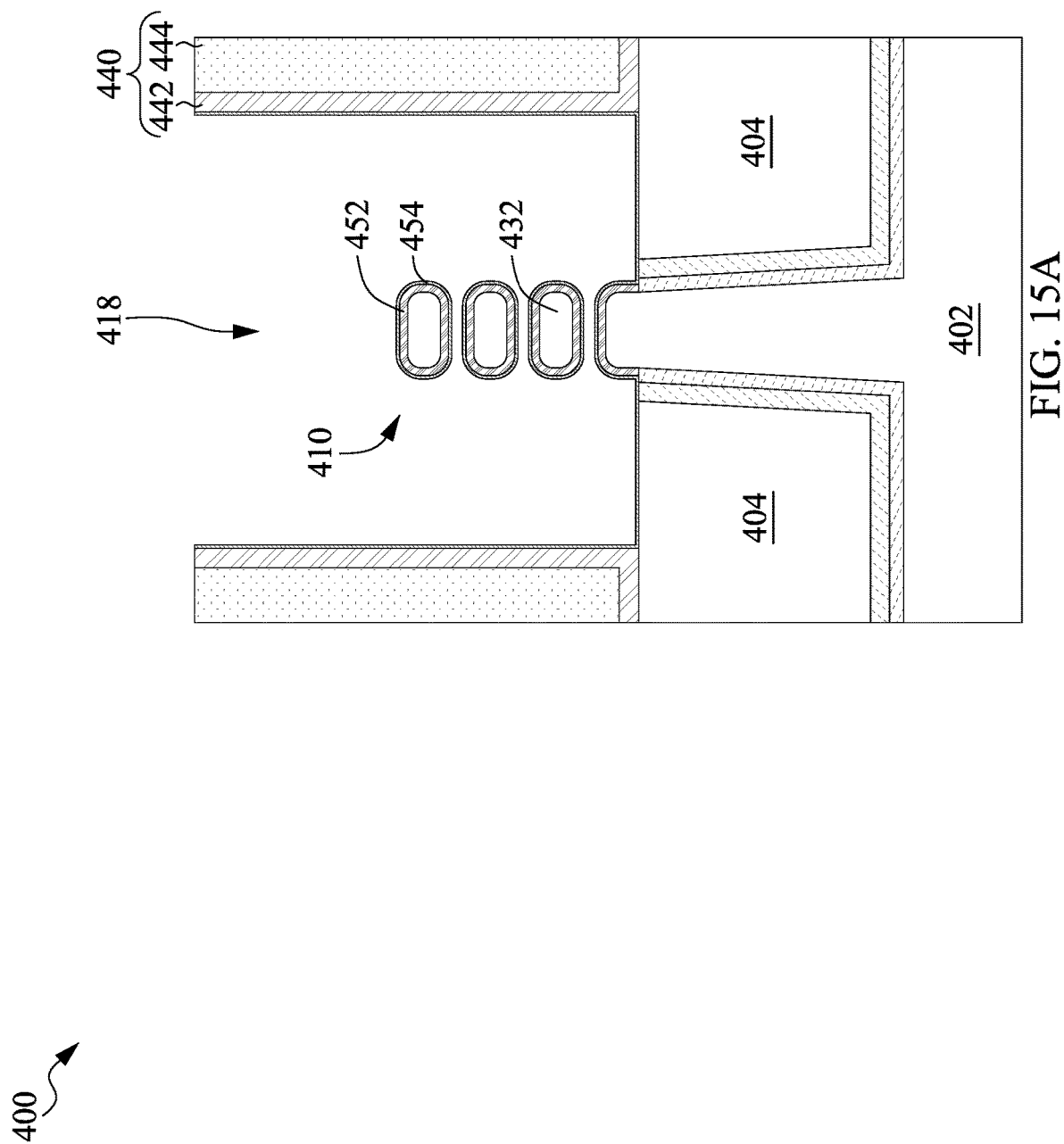

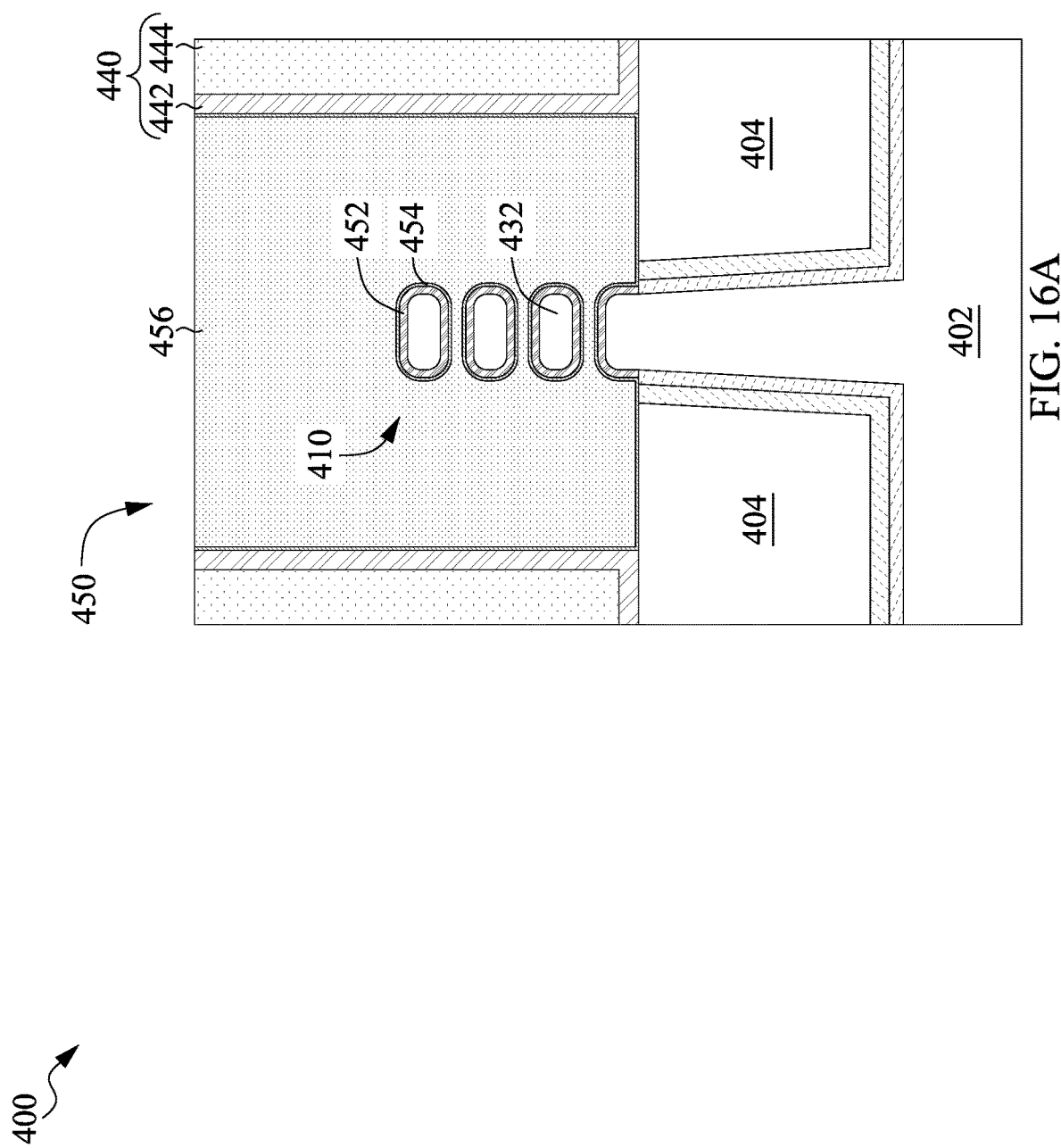

METHOD FOR FORMING MULTI-GATE SEMICONDUCTOR STRUCTURE

BACKGROUND

As the semiconductor industry develops smaller and smaller nanoscale products and processes in pursuit of greater device density, higher performance, and lower costs, challenges of downscaling both fabrication and design have led to development of three-dimensional designs, such as a multi-gate field effect transistor (FET) including a fin FET (FinFET) and a gate-all-around (GAA) FET. In a FinFET, a gate electrode is positioned adjacent to three side surfaces of a channel region with a gate dielectric layer interposed therebetween. Because a gate structure surrounds a fin on three sides, a transistor essentially has three gates controlling a current through the fin or channel region. However, the fourth side, a bottom part of the channel region, is positioned far away from the gate electrode and thus is not under close gate control. In contrast to the FinFET, a GAA FET includes an arrangement wherein all side surfaces of the channel region are surrounded by the gate electrode, allowing fuller depletion in the channel region and resulting in fewer short-channel effects due to a steeper sub-threshold current swing (SS) and smaller drain induced barrier lowering (DIBL).

Although existing GAA FET devices and methods of fabricating GAA FET devices have been generally adequate for their intended purpose, such devices and methods have not been entirely satisfactory in all aspects.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIGS. 5A and 5B are cross-sectional views taken along line I-I' and line II-II' of FIG. 4, respectively, according to aspects of the present disclosure in one or more embodiments.

FIGS. 7A-7B, 8A-8B, 9A-9B, 10A-10B, 11A-11B, 12A-12B, 13A-13B, 14A-14B, 15A-15B and 16A-16B are schematic drawings illustrating the multi-gate semiconductor structure at various fabrication stages constructed according to aspects of the present disclosure in one or more embodiments.

DETAILED DESCRIPTION

Figure 1:
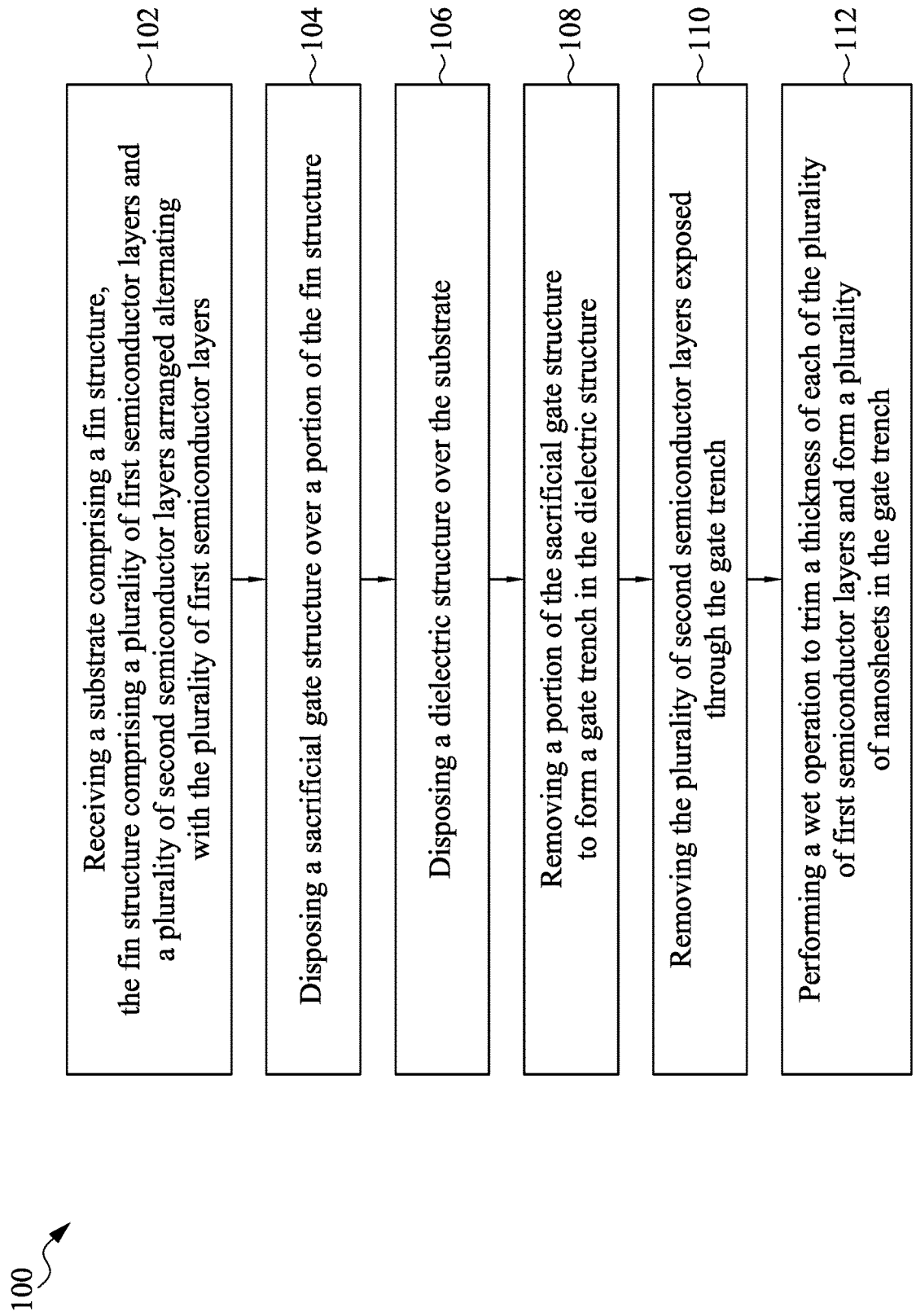
FIG. 1 is a flowchart representing a method for manufacturing a multi-gate semiconductor structure according to aspects of one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. It should be appreciated that the following figures are not drawn to scale; rather, these figures are merely intended for illustration.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Gate-all-around (GAA) transistor structures may be patterned by any suitable method. For example, the GAA structures may be patterned using one or more photolithography processes, including double-patterning or multi-patterning processes. Generally, the double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and remaining spacers may then be used to pattern the GAA structure.

GAA transistor structures may include nanosheet (or nanowire) structures, which are a promising candidate for logic device applications in future technologies. The nanosheet structures may be formed through a channel release operation. The channel release operation may correspond to a thickness of the nanosheet structure and/or a surface condition of the nanosheet structure. The channel release operation may also be related to an electrical performance (e.g., drain-induced barrier lowering (DIBL), interface trap density (Dit), etc.) of the nanosheet structure. Although existing methods of fabricating the GAA transistor structures have been generally adequate for their intended purpose, such methods have not been entirely satisfactory in all aspects. For example, a sidewall spacer and/or an inner spacer may be consumed during existing channel release operations. Such damage to the sidewall spacer and/or the inner spacer may cause a leakage current and low reliability, and thus may lead to device failure. An alternative approach to forming the nanosheet structures is therefore of primary importance.

Some embodiments of the present disclosure provide methods for manufacturing a multi-gate semiconductor structure that provides one or more improvements over existing approaches. By cleaning exposed surfaces of nanosheet structures and trimming the nanosheet structures through a wet operation, damage to a sidewall spacer and/or an inner spacer may be mitigated. Accordingly, the resulting multi-gate semiconductor structure may provide improved reliability.

It should be noted that the present disclosure presents embodiments in the form of multi-gate transistors or fin-type multi-gate transistors referred to herein as FinFET devices. The FinFET devices may be GAA devices, Omega-gate (a-gate) devices, Pi-gate (H-gate) devices, dual-gate devices, tri-gate devices, bulk devices, silicon-on-insulator (SOI) devices, and/or other configurations. One of ordinary skill may recognize other examples of semiconductor devices that may benefit from aspects of the present disclosure.

FIG. 1 is a flowchart representing a method 100 for manufacturing a multi-gate semiconductor structure according to aspects of one or more embodiments of the present disclosure. The method 100 includes an operation 102, in which a substrate is received. In some embodiments, the substrate includes a fin structure. The fin structure includes a plurality of first semiconductor layers and a plurality of second semiconductor layers arranged alternating with the plurality of first semiconductor layers. The method 100 includes an operation 104, in which a sacrificial gate structure is disposed over a portion of the fin structure. The method 100 includes an operation 106, in which a dielectric structure is disposed over the substrate. The method 100 includes an operation 108, in which a portion of the sacrificial gate structure is removed to form a gate trench in the dielectric structure. The method 100 includes an operation 110, in which the plurality of second semiconductor layers exposed through the gate trench is removed. The method 100 includes an operation 112, in which a wet operation is performed to trim a thickness of each of the plurality of first semiconductor layers and form a plurality of nanosheets in the gate trench. The method 100 will be further described according to one or more embodiments. It should be noted that the operations of the method 100 may be rearranged or otherwise modified within the scope of the various aspects. It should further be noted that additional processes may be provided before, during, and after the method 100, and that some other processes may only be briefly described herein. Thus, other implementations are possible within the scope of the various aspects described herein.

Figure 2:
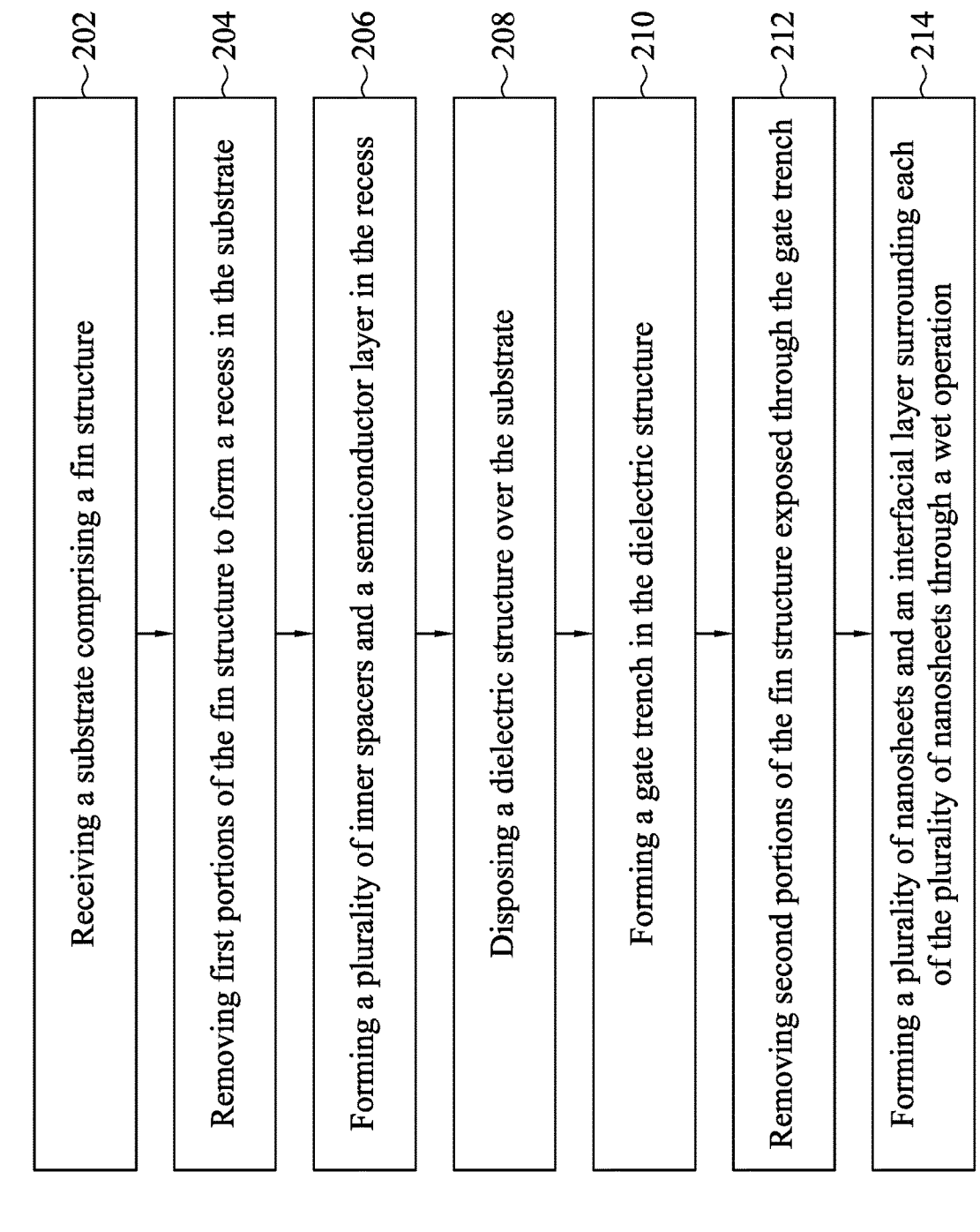
FIG. 2 is a flowchart representing a method for manufacturing a multi-gate semiconductor structure according to aspects of one or more embodiments of the present disclosure.

FIG. 2 is a flowchart representing a method 200 for manufacturing a multi-gate semiconductor structure according to aspects of one or more embodiments of the present disclosure. The method 200 includes an operation 202, in which a substrate including a fin structure is received. The method 200 includes an operation 204, in which first portions of the fin structure are removed to form a recess in the substrate. The method 200 includes an operation 206, in which a plurality of inner spacers and a semiconductor layer are formed in the recess. The method 200 includes an operation 208, in which a dielectric structure is disposed over the substrate. The method 200 includes an operation 210, in which a gate trench is formed in the dielectric structure. The method 200 includes an operation 212, in which second portions of the fin structure exposed through the gate trench are removed. The method 200 includes an operation 214, in which a plurality of nanosheets and an interfacial layer surrounding each of the plurality of nanosheets are formed through a wet operation. The method 200 will be further described according to one or more embodiments. It should be noted that the operations of the method 200 may be rearranged or otherwise modified within the scope of the various aspects. It should further be noted that additional processes may be provided before, during, and after the method 200, and that some other processes may only be briefly described herein. Thus, other implementations are possible within the scope of the various aspects described herein.

Figure 3:
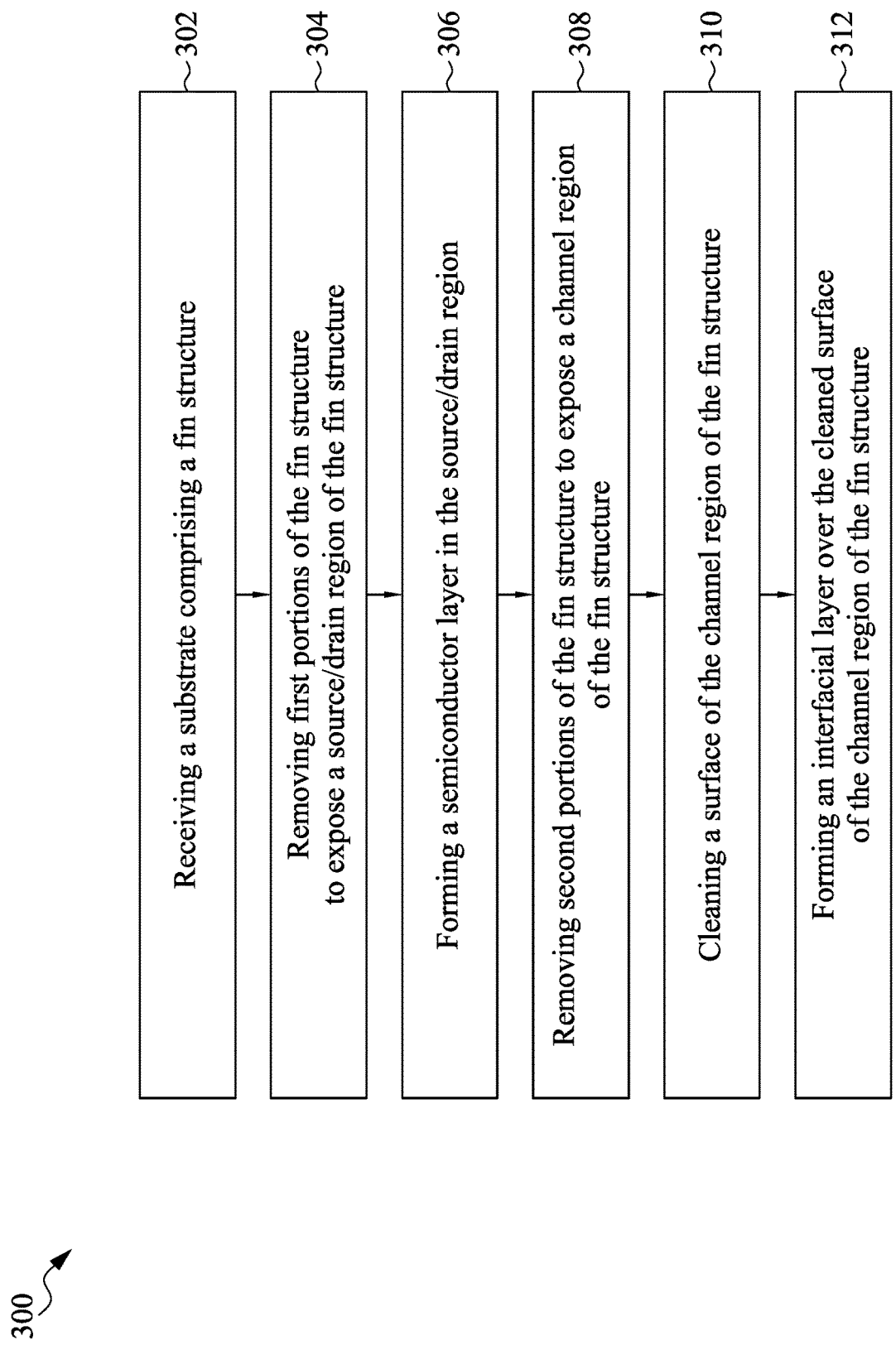
FIG. 3 is a flowchart representing a method for manufacturing a multi-gate semiconductor structure according to aspects of one or more embodiments of the present disclosure.

FIG. 3 is a flowchart representing a method 300 for manufacturing a multi-gate semiconductor structure according to aspects of one or more embodiments of the present disclosure. The method 300 includes an operation 302, in which a substrate including a fin structure is received. The method 300 includes an operation 304, in which first portions of the fin structure are removed to expose a source/drain region of the fin structure. The method 300 includes an operation 306, in which a semiconductor layer is formed in the source/drain region. The method 300 includes an operation 308, in which second portions of the fin structure are removed to expose a channel region of the fin structure. The method 300 includes an operation 310, in which a surface of the channel region of the fin structure is cleaned. The method 300 includes an operation 312, in which an interfacial layer is formed over the cleaned surface of the channel region of the fin structure. The method 300 will be further described according to one or more embodiments. It should be noted that the operations of the method 300 may be rearranged or otherwise modified within the scope of the various aspects. It should further be noted that additional processes may be provided before, during, and after the method 300, and that some other processes may only be briefly described herein. Thus, other implementations are possible within the scope of the various aspects described herein. Source/drain region(s) may refer to a source or a drain, individually or collectively dependent upon the context.

Figure 4:
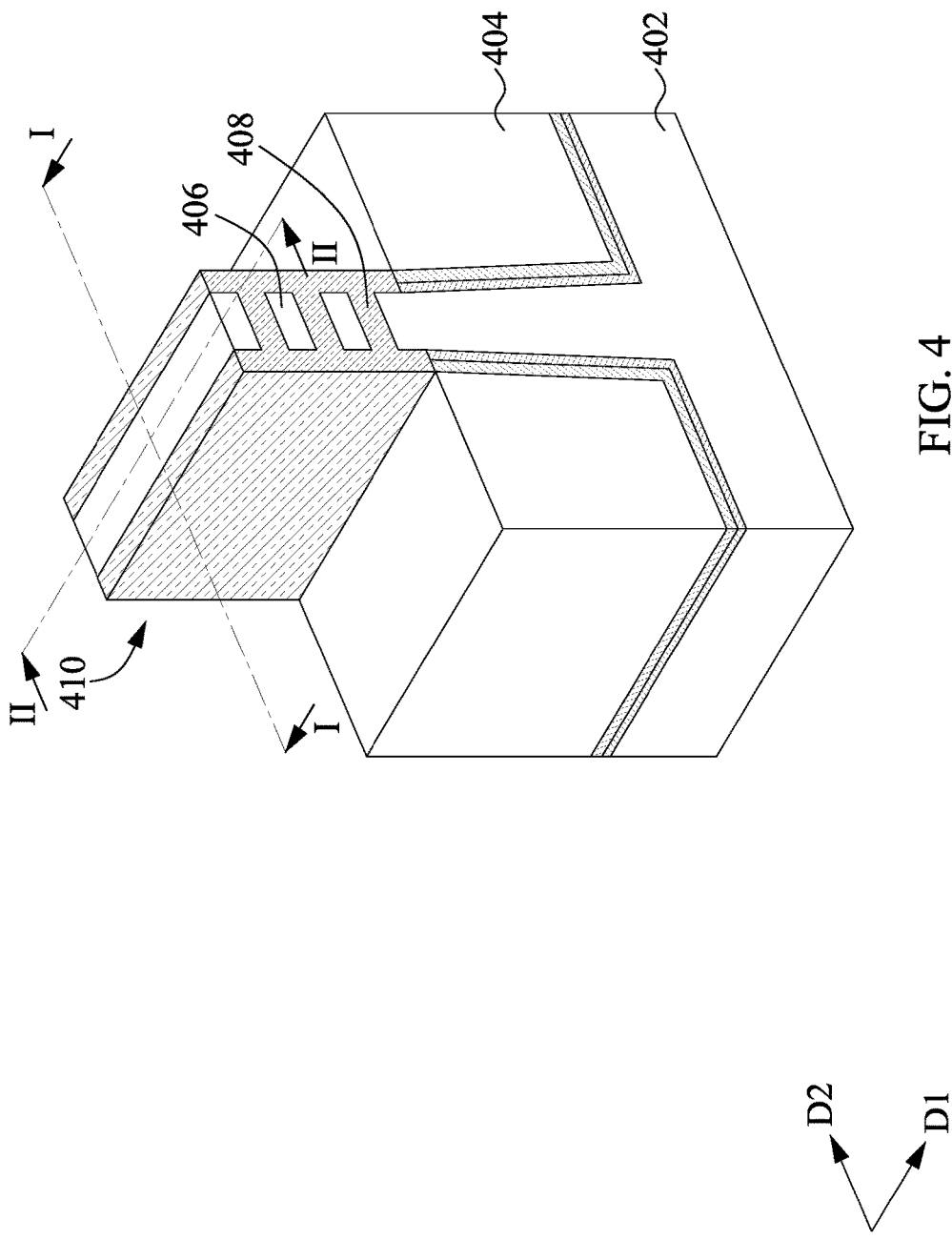
FIG. 4 is a schematic drawing illustrating a multi-gate semiconductor structure 400 at a fabrication stage constructed according to aspects of the present disclosure in one or more embodiments.
Figure 5A:
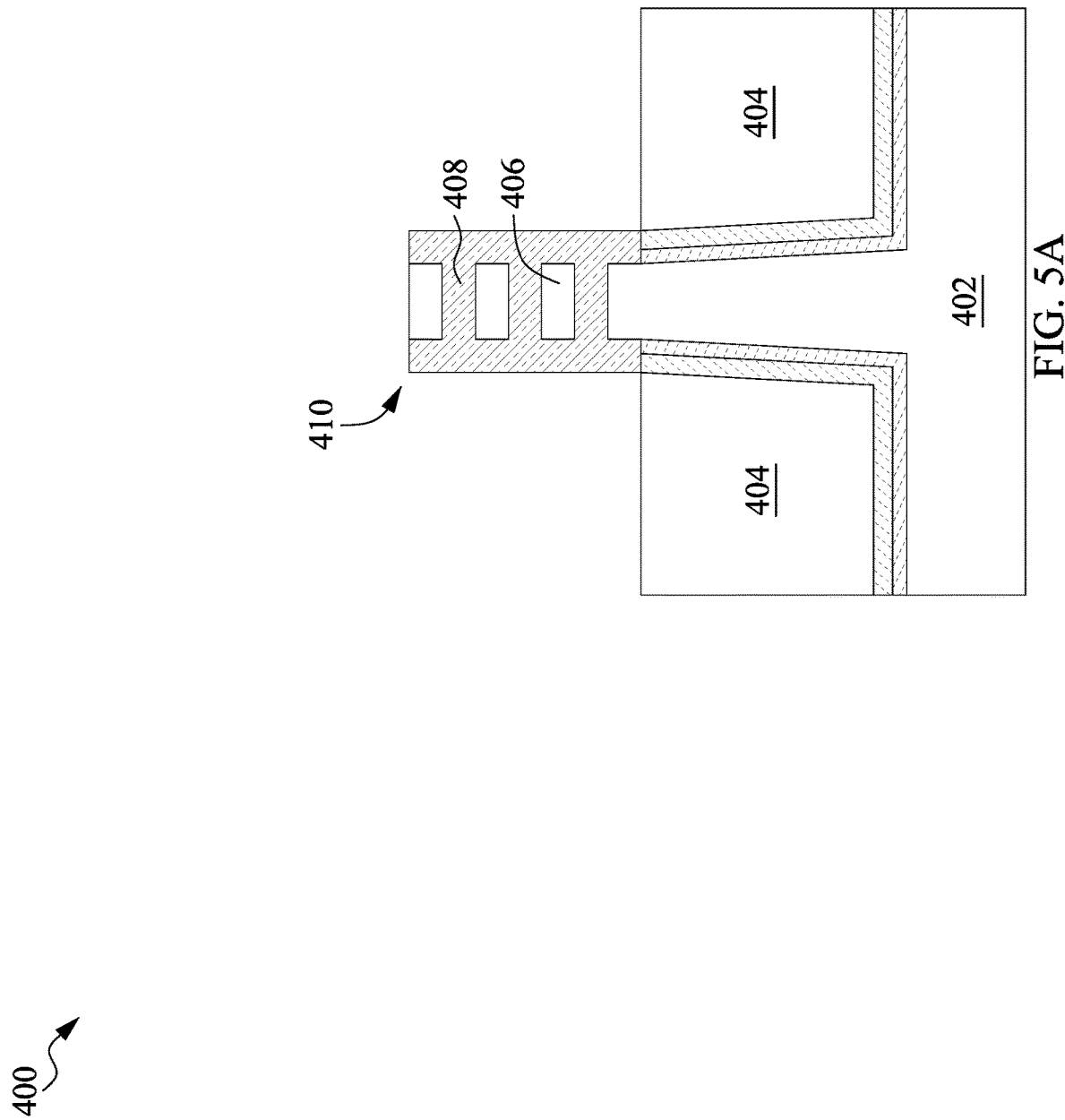

FIG. 4 is a schematic drawing illustrating a multi-gate semiconductor structure 400 at a fabrication stage constructed according to aspects of the present disclosure in one or more embodiments. FIGS. 5A and 5B are cross-sectional views taken along line and line II-II' of FIG. 4, respectively, according to aspects of the present disclosure in one or more embodiments. Referring to FIGS. 4, 5A and 5B, a substrate 402 is provided or received. The respective step is shown as the operation 102 of the method 100 in FIG. 1, the operation 202 of the method 200 in FIG. 2 or the operation 302 of the method 300 in FIG. 3. In some embodiments, the substrate 402 may be a semiconductor substrate such as a silicon substrate. The substrate 402 may also include other semiconductors such as germanium (Ge), silicon carbide (SiC), silicon germanium (SiGe), or diamond. Alternatively, the substrate 402 may include a compound semiconductor and/or an alloy semiconductor. The substrate 402 may include various layers, including conductive or insulating layers formed on a semiconductor substrate. The substrate 402 may include various doping configurations depending on design requirements as is known in the art. For example, different doping profiles (e.g., n wells, p wells) may be formed on the substrate 402 in regions designed for different device types (e.g., n-type field effect transistors (NFET), or p-type field effect transistors (PFET)). The suitable doping may include ion implantation of dopants and/or diffusion processes. The substrate 402 typically has isolation features (e.g., shallow trench isolation (STI) features) 404 interposing the regions providing different device types. Furthermore, the substrate 402 may optionally include an epitaxial layer (epi-layer), may be strained for performance enhancement, may include an SOI structure, and/or may have other suitable enhancement features. In some embodiments, a strain relaxed buffer (SRB) layer (not shown) may be formed over the substrate 402. The SRB layer may be different in composition from the substrate 402 in order to create lattice strain at the interface with the substrate 402. For example, in some embodiments, the substrate 402 includes silicon and is substantially free of germanium while the SRB layer includes SiGe.

Still referring to FIGS. 4, 5A and 5B, in some embodiments, a stack including semiconductor layers is formed over the substrate 402. In embodiments that include an SRB layer disposed on the substrate 402, the stack of semiconductor layers may be disposed on the SRB layer. The stack of semiconductor layers may include alternating layers of different compositions. For example, in some embodiments, the stack includes semiconductor layers 406 of a first composition alternating with semiconductor layers 408 of a second composition. By way of example, growth of the layers of the stack may be performed by a molecular beam epitaxy (MBE) process, a metalorganic chemical vapor deposition (MOCVD) process, and/or other suitable epitaxial growth processes. Although three semiconductor layers 406 and three semiconductor layers 408 are shown, it should be understood that the stack may include any number of layers of any suitable composition with various examples including between 2 and 10 semiconductor layers 406 and between 2 and 10 semiconductor layers 408. As explained below, the different compositions of the layers in the stack (e.g., semiconductor layers 406 and semiconductor layers 408) may be used to selectively process some of the layers. Accordingly, the compositions may have different oxidation rates, etchant sensitivity, and/or other differing properties. The semiconductor layers 406 and 408 may have thicknesses chosen based on device performance considerations. In some embodiments, the semiconductor layers 406 are substantially uniform in thickness, and the semiconductor layers 408 are substantially uniform in thickness. In some embodiments, the thickness of the semiconductor layers 406 may be less than the thickness of the semiconductor layers 408, but the disclosure is not limited thereto.

In some embodiments, the semiconductor layers 406 may include a first semiconductor material such as Si while the semiconductor layers 408 may include the first semiconductor material and a second semiconductor material with a lattice constant greater than a lattice constant of the first semiconductor material. For example, the semiconductor layers 408 may include SiGe, but the disclosure is not limited thereto. Additionally, Ge concentration in the semiconductor layers 408 may be less than or equal to approximately 50%, but the disclosure is not limited thereto. In other embodiments, the semiconductor layers 408 may include other materials such as a compound semiconductor such as SiC, gallium arsenide (GaAs), gallium phosphide (GaP), indium phosphide (InP), indium arsenide (InAs), and/or indium antimonide (InSb), an alloy semiconductor such as SiGe, GaAsP, AlInAs, AlGaAs, InGaAs, GaInP, and/or GaInAsP, or combinations thereof. In some embodiments, the semiconductor layers 406 and 408 may be undoped or substantially dopant-free, where, for example, no doping is performed during the epitaxial growth process. Alternatively, the semiconductor layers 406 and 408 may be doped. For example, the semiconductor layers 406 or 408 may be doped with a p-type dopant such as boron (B), aluminum (Al). In, and Ga for forming a p-type channel, or an n-type dopant such as P, As, Sb, for forming an n-type channel.

Still referring to FIGS. 4, 5A and 5B, at least a fin structure 410 is formed over the substrate 402 from the stack of semiconductor layers 406/408. The fin structure 410 may be fabricated using suitable operations including photolithography and etch operations. In some embodiments, the forming of the fin structure 410 may further include a trim process to decrease a width and/or a height of the fin structures 410. The trim process may include wet or dry etching processes. The height and width of the fin structure 410 may be chosen based on device performance considerations. Further, the fin structure 410 may extend along a first direction D1. Accordingly, the substrate 402 including the at least one fin structure 410 is received. In some embodiments, the fin structure 410 further includes a semiconductor layer 408 laterally surrounding the stack of semiconductor layers 406/408.

Figure 6:
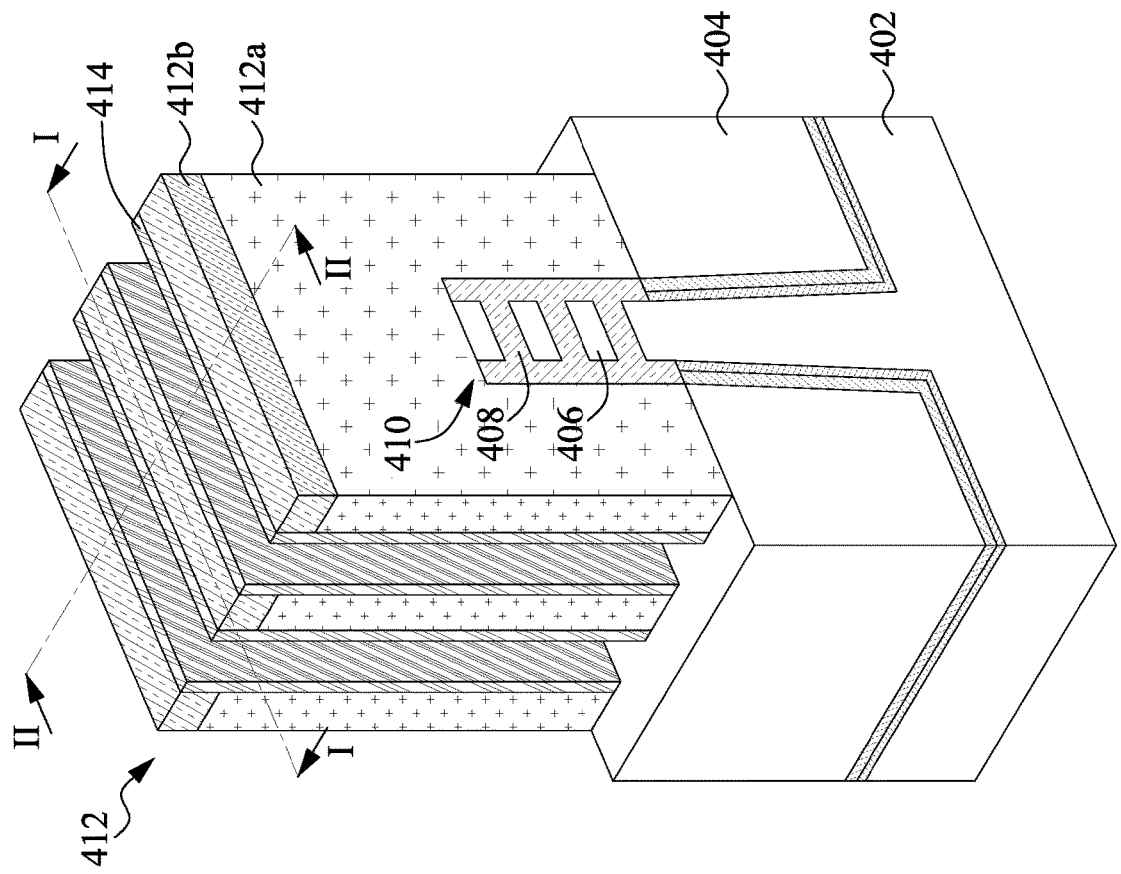
FIG. 6 is a schematic drawing illustrating a multi-gate semiconductor structure at a fabrication stage constructed according to aspects of the present disclosure in one or more embodiments.

FIG. 6 is a schematic drawing illustrating a multi-gate semiconductor structure 400 at a fabrication stage constructed according to aspects of the present disclosure in one or more embodiments. FIG. 6 further illustrates several reference cross-sections. Cross-section I-I is along a longitudinal axis of the fin structure 410. Cross-section II-II is perpendicular to cross-section I-I. Subsequent figures refer to these reference cross-sections for clarity. FIGS. 7A-7B, 8A-8B, 9A-9B, 10A-10B, 11A-11B, 12A-12B, 13A-13B, 14A-14B, 15A-15B and 16A-16B are schematic drawings illustrating the multi-gate semiconductor structure 400 at various fabrication stages constructed according to aspects of the present disclosure in one or more embodiments. FIGS. 7A, 8A, 9A, 10A, 11A, 12A, 13A, 13A, 14A, 15A and 16A are cross-sectional views illustrated along reference cross-section I-I in FIG. 6, except three gate structures are shown. FIGS. 7B, 8B, 9B, 10B, 11B, 12B, 13B, 14B, 15B and 16B are cross-sectional views illustrated along reference cross-section II-II in FIG. 6.

Referring to FIGS. 6, 7A and 7B, in some embodiments, a liner (not shown) may be formed over the fin structure 410 and the substrate 402. Next, one or more sacrificial gate structures 412 are disposed over a portion of the fin structure 410. The respective step is shown as the operation 104 of the method 100 in FIG. 1. The sacrificial gate structure 412 may be replaced at a later processing stage by a high-K dielectric layer and metal gate electrode as discussed below. In some embodiments, the sacrificial gate structure 412 is formed over the substrate 402 and extends along a second direction D2, which is not parallel to the first direction D1. Additionally, the first direction D1 and the second direction D2 are in the same plane. As shown in FIGS. 6 and 7A, a portion of the fin structure 410 underlying the sacrificial gate structure 412 may be referred to as a channel region. The sacrificial gate structure 412 may also define a source/drain region of the fin structure 410, for example, portions of the fin structure 410 adjacent to and on opposing sides of the channel region. In some embodiments, the sacrificial gate structure 412 may include at least a polysilicon layer 412*a* and a patterned hard mask 412*b* for defining the sacrificial gate structure.

Still referring to FIGS. 6 and 7B, in some embodiments, a spacer 414 may be disposed over sidewalk of the sacrificial gate structure 412, and portions of the fin structure 410 are exposed through the sacrificial gate structure 412 and the spacer 414. In some embodiments, the spacer 414 includes one or more insulating materials, such as SiN, SiO, SiC, SiOC, SiCN, SiOCN, other materials, or a combination thereof, but the disclosure is not limited thereto. As shown in FIGS. 6 and 7B, the sidewalk of the sacrificial gate structure 412 are covered by the spacer 414. In some embodiments, portions of the liner may be removed during or after the forming of the spacer 414, and thus portions of the fin structure 410 are exposed as shown in FIGS. 6 and 7B.

Referring to FIGS. 8A and 8B, in some embodiments, the portions of the fin structure 410 exposed through the sacrificial gate structure 412 and the spacer 414 are removed. The respective step is shown as the operation 204 of the method 200 in FIG. 2 or the operation 304 of the method 300 in FIG. 3. In some embodiments, portions of the semiconductor layers 406 and portions of the semiconductor layers 408 exposed through the sacrificial gate structure 412 and the spacer 414 are removed, thereby forming at least a recess 416 in the substrate 402 as shown in FIG. 8B. The semiconductor layers 406 and the semiconductor layers 408 are exposed through sidewalls of the recess 416, and the substrate 402 is exposed through a bottom of the recess 416. In some embodiments, a portion of each of the exposed semiconductor layers 408 is removed and thus a plurality of notches (not shown) are formed. In some embodiments, an insulating layer (not shown) is formed over the substrate 402 and a suitable etching operation is then performed. Thus, a plurality of inner spacers 411 are formed in the notches as shown in FIG. 8B. The respective step is shown as the operation 206 of the method 200 in FIG. 2. Consequently, the semiconductor layers 406 and the inner spacers 411 are exposed. In other words, the semiconductor layers 408 are enclosed by the semiconductor layers 406 and the inner spacers 411. In some embodiments, the inner spacers 411 include one or more insulating materials such as SiN, SiO, SiC, SiOC, SiCN, SiOCN, other materials, or a combination thereof, but the disclosure is not limited thereto.

Referring to FIGS. 9A and 9B, in some embodiments, a semiconductor layer 420 is formed in the recess 416. The respective step is shown as the operation 206 of the method 200 in FIG. 2 or the operation 306 of the method 300 in FIG. 3. In some embodiments, the semiconductor layer 420 is a doped epitaxial semiconductor layer. In some embodiments, the semiconductor layer 420 is a phosphorus-doped silicon (SiP) epitaxial layer or a boron-doped silicon germanium (SiGeB) epitaxial layer, but the disclosure is not limited thereto. Additionally, the semiconductor layer 420 covers the semiconductor layers 406, the inner spacers 411 and the bottom of the recess 416.

Figure 10A:
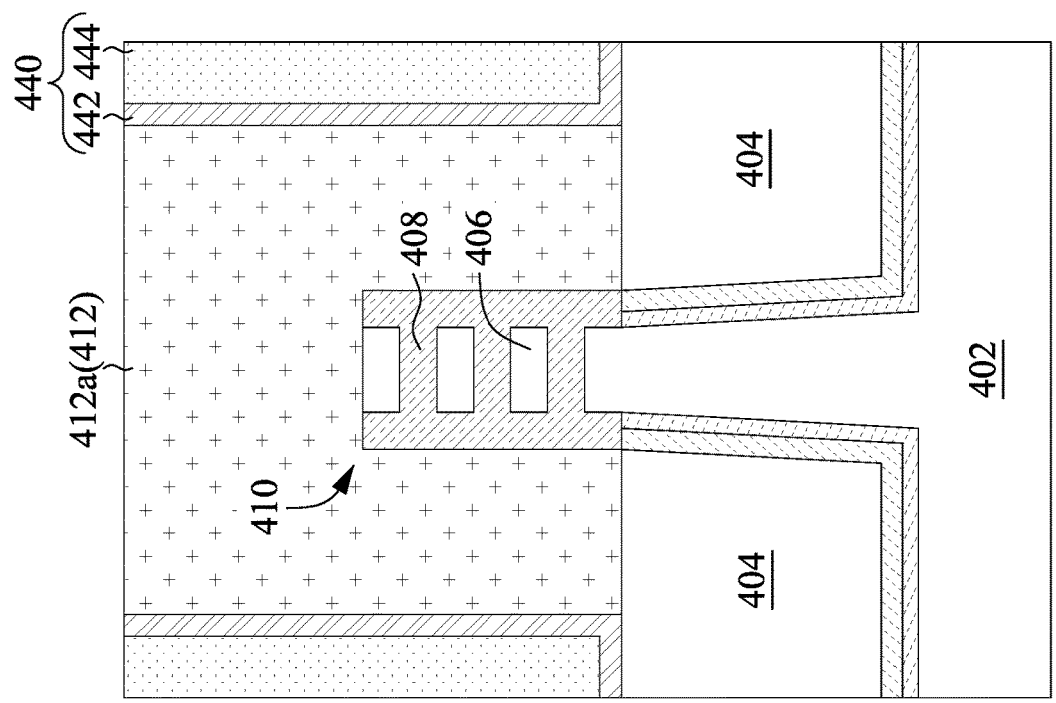
Figure 10B:
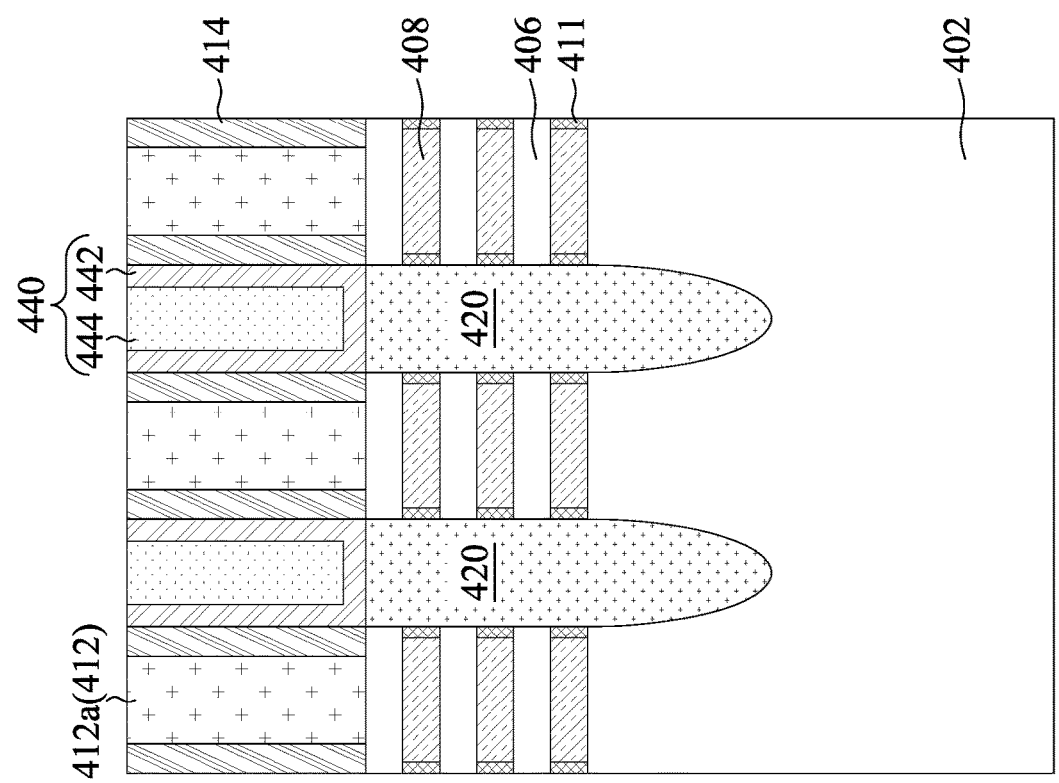

Referring to FIGS. 10A and 10B, in some embodiments, one or more dielectric structures 440 are disposed over the substrate 402. The respective step is shown as the operation 106 of the method 100 in FIG. 1 or the operation 208 of the method 200 in FIG. 2. The dielectric structure 440 fills the recess 416. In some embodiments, the dielectric structure 440 may include an etch-stop layer (e.g., a contact etch stop layer (CESL)) 442 and various dielectric layers (e.g., an inter-layer dielectric (ILD) layer) 444 formed on the substrate 402 after the forming of the semiconductor layer 420. In some embodiments, the CESL 442 includes a SiN layer, a SiCN layer, a SiON layer, and/or other materials known in the art. In some embodiments, the ILD layer 444 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after the CESL 442 and the ILD layer 444 are deposited, a planarization process, such as a chemical mechanical planarization (CMP) operation, may be performed to form the dielectric structure 440 and to expose a top surface of the sacrificial gate structure 412 as shown in FIGS. 10A and 10B. In some embodiments, the planarization is performed to expose at least a top surface of the polysilicon layer 412*a* of the sacrificial gate structure 412.

Referring to FIGS. 11A and 11B, in some embodiments, a portion of the sacrificial gate structure 412 is subsequently removed to form a gate trench 418 in the dielectric structure 440. The respective step is shown as the operation 108 of the method 100 in FIG. 1, the operation 210 of the method 200 in FIG. 2 or the operation 308 of the method 300 in FIG. 3. In some embodiments, a patterned protecting layer (not shown) is formed over the dielectric structure 440, and thus the dielectric structure 440 is protected and impervious to the formation of the gate trench 418. The patterned protecting layer serves as an etching mask for subsequent operations. The patterned protecting layer may be removed after formation of a gate conductive layer.

As shown in FIG. 11B, the spacer 414 is exposed through sidewalk of the gate trench 418, and the fin structure 410 is exposed through the gate trench 418. Subsequently, the liner layer (not shown) disposed over the fin structure 410 is removed. Additionally, the semiconductor layers 408 are then removed. The respective step is shown as the operation 110 of the method 100 in FIG. 1, the operation 212 of the method 200 in FIG. 2 or the operation 308 of the method 300 in FIG. 3. Further, the plurality of semiconductor layers 406 serving as channel regions are suspended in the gate trench 418. As shown in FIG. 11B, the inner spacers 411 are therefore exposed through the gate trench 418. In some embodiments, after the removal of the semiconductor layers 408, an oxidized component or a fluoride component may be formed on exposed surfaces of the semiconductor layers 406. For example, the oxidized component may include Si and O, and the fluoride component may include Si and F, but the present disclosure is not limited thereto.

Figure 12A:
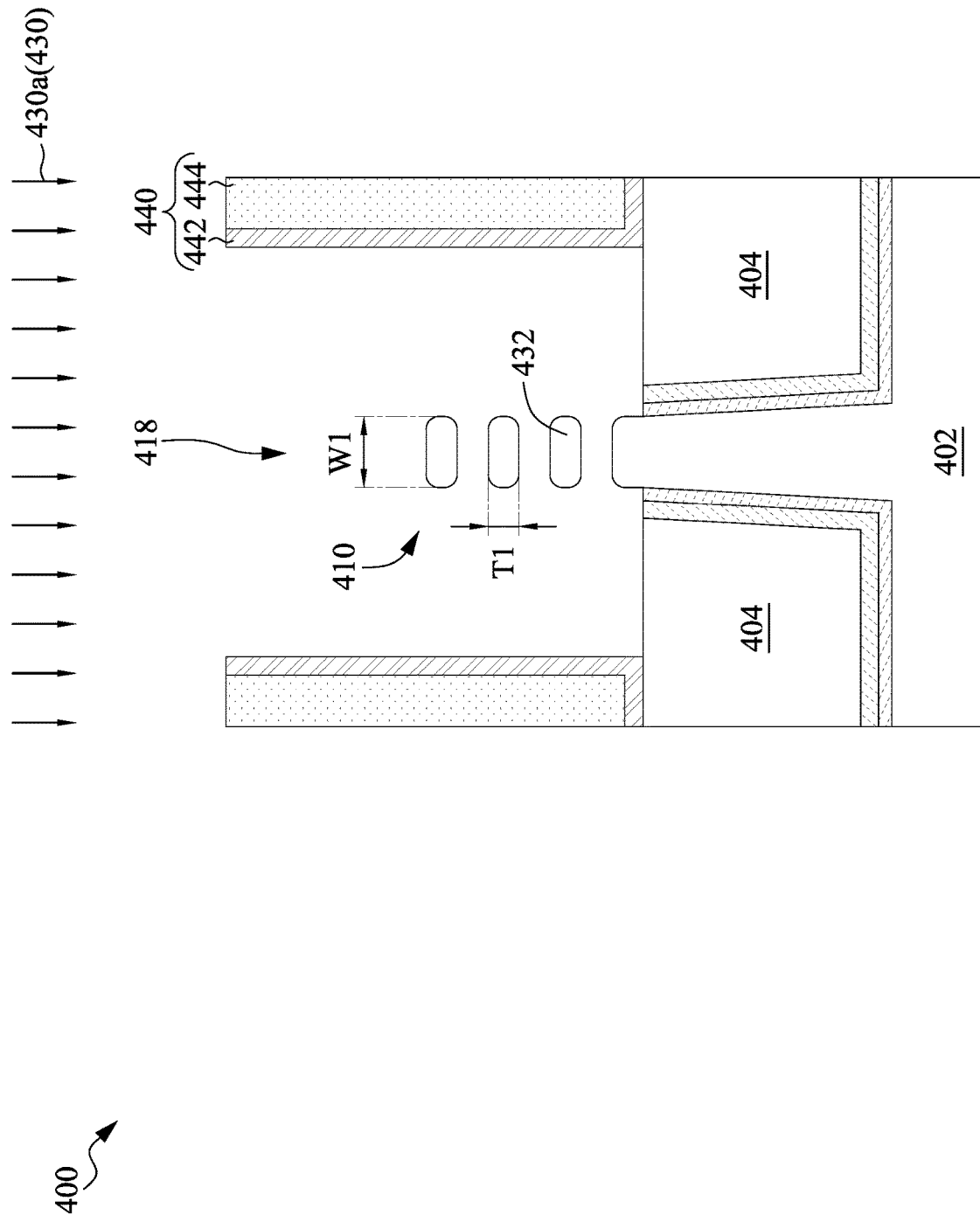
Figure 12B:
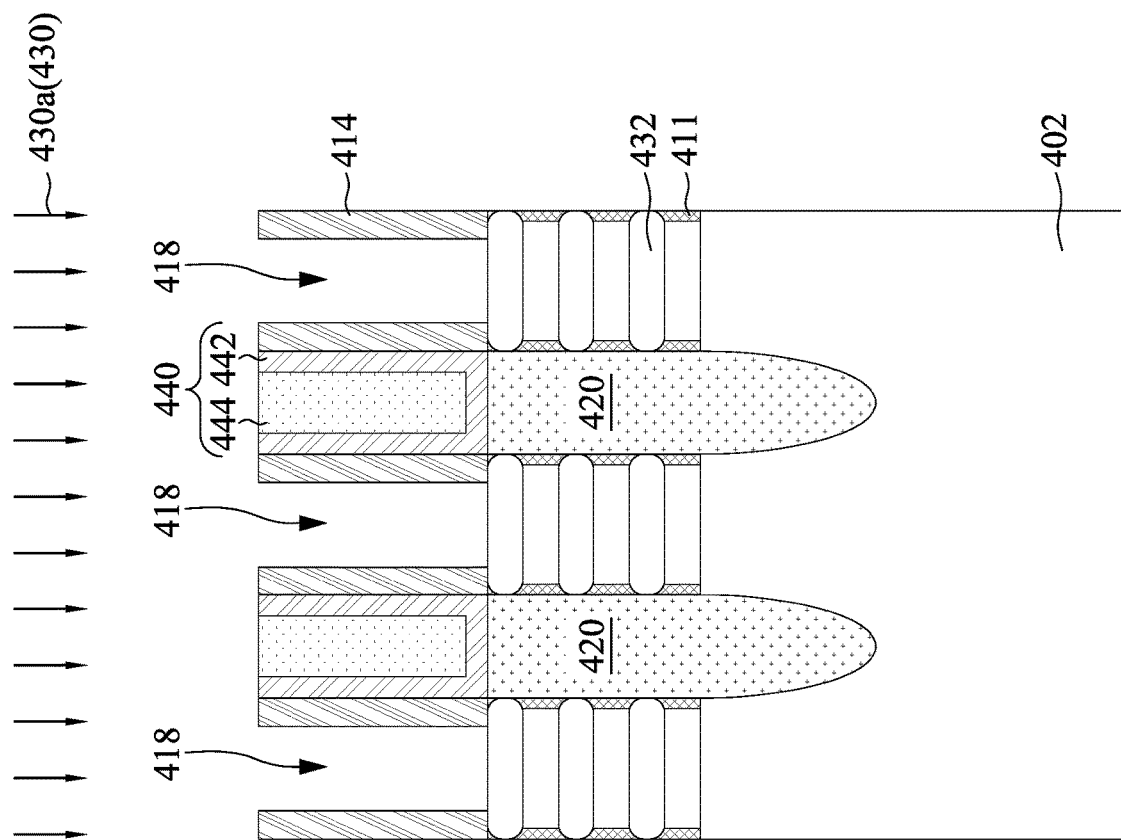

Referring to FIGS. 12A and 12B, in some embodiments, a wet operation 430 is performed. The respective step is shown as the operation 112 of the method 100 in FIG. 1, the operation 214 of the method 200 in FIG. 2 or the operation 310 of the method 300 in FIG. 3. In some embodiments, the wet operation 430 is performed to clean the exposed surfaces of the semiconductor layers 406. The wet operation 430 may include a wet cleaning operation 430a configured to remove the oxidized component or the fluoride component on the exposed surfaces of the semiconductor layers 406. In some embodiments, the wet cleaning operation 430a is further configured to remove potential residues (resulting from the removal of the semiconductor layer 408) on the exposed surfaces of the semiconductor layers 406, thereby improving channel mobility and Dit of the multi-gate semiconductor structure 400. In some embodiments, the wet cleaning operation 430a includes an isotropic wet etching. In other words, an end of each of the semiconductor layers 406 is rounded after the wet cleaning operation 430a as shown in FIG. 12A. In some embodiments, the inner spacers 411 and the spacer 414 remain substantially intact after the wet cleaning operation 430a. Accordingly, issues, such as leakage current, may be mitigated.

In some embodiments, the wet operation 430 is further configured to trim a thickness of each of the semiconductor layers 406. Accordingly, a plurality of nanosheets 432, which previously comprised the semiconductor layers 406, are formed in the gate trench 418. In some embodiments, the nanosheets 432 may be slightly etched to obtain various desirable dimensions and shapes, and the various desired dimensions and shapes may be chosen based on device performance considerations. In some embodiments, the multi-gate semiconductor structure 400 may be formed for an n-channel FET or a p-channel FET. In some embodiments where the nanosheets 432 provide proper function to the n-channel FET, a thickness (also referred to as sheet height) T1 of the nanosheet 432 is substantially in a range between about 3.5 nanometers and about 6.0 nanometers, and a width (also referred to as sheet width) W1 of the nanosheet 432 is substantially in a range between about 17 nanometers and about 30 nanometers. In some embodiments where the nanosheets 432 provide proper function to the p-channel FET, the thickness T1 is also substantially between about 3.5 nanometers and about 6.0 nanometers, while the width W1 is substantially between about 8 nanometers and about 20 nanometers.

Figure 13A:
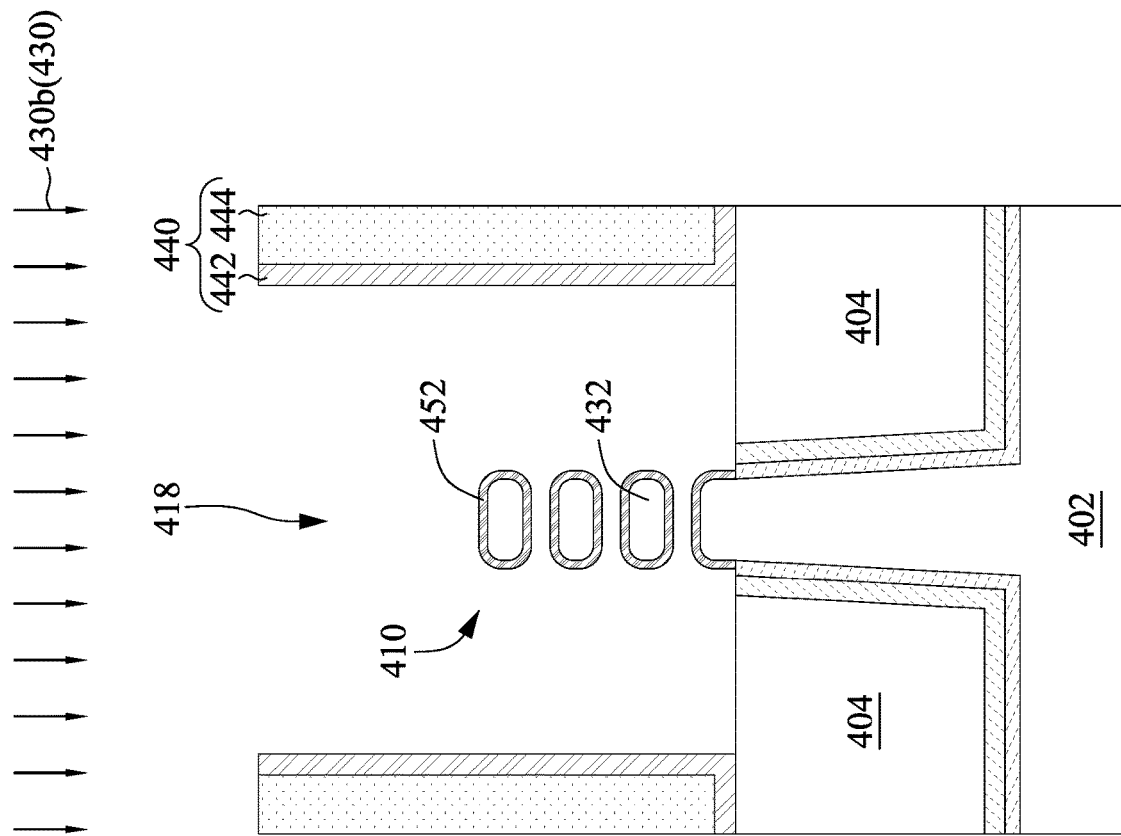
Figure 13B:
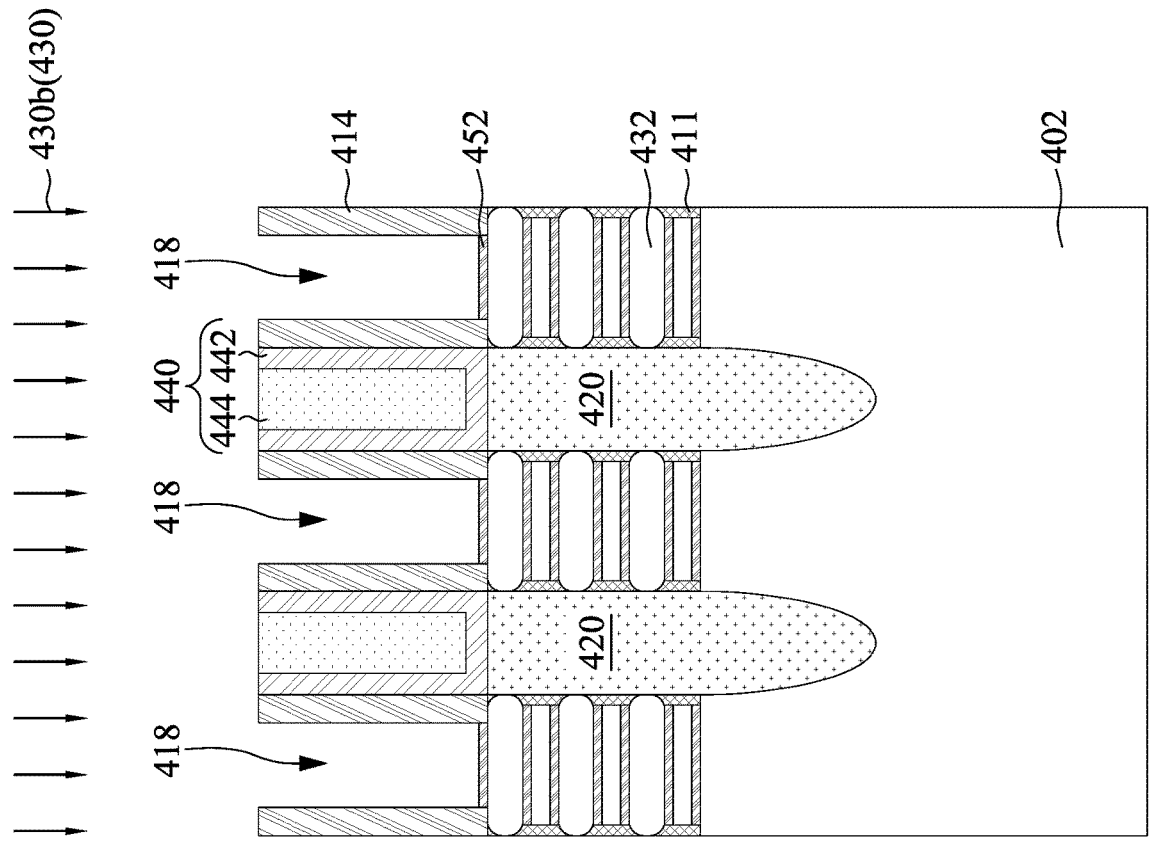

Referring to FIGS. 13A and 13B, in some embodiments, an interfacial layer (IL) 452 is formed through the wet operation 430. The respective step is shown as the operation 214 of the method 200 in FIG. 2 or the operation 312 of the method 300 in FIG. 3. The wet operation 430 may include a wet oxidation operation 430b configured to form the IL 452. The IL 452 is formed to surround each of the nanosheets 432 exposed in the gate trench 418. In some embodiments, the IL 452 may include an oxide-containing material such as SiO or SiON. In some embodiments, the inner spacers 411 and the spacer 414 remain substantially intact after the wet oxidation operation 430b. In other words, the inner spacers 411 and the spacer 414 remain substantially intact after the wet operation 430.

In some embodiments, the wet cleaning operation 430a and the wet oxidation operation 430b are performed concurrently in a single chamber. In some embodiments, the wet cleaning operation 430a and the wet oxidation operation 430b are performed concurrently in a single wet tool. The wet operation 430 may include any suitable oxidant or alkaline. For example, the wet operation 430 may include a cleaning solution, consisting of a mixture of ammonium-hydroxide ($NH_4OH$), hydrogen-peroxide ($H_2O_2$), and water ($H_2O$). This mixture is also referred to as the ammonium-hydroxide/hydrogen-peroxide mixture (APM). Other candidates for the wet operation 430 may include ozonated DI water (DI-$O_3$ water), ammonium-hydroxide, a mixture of hydrogen-peroxide and water, a mixture of hydrofluoric acid (HF) and ozonated DI water, or another suitable etching solution. The concentration of each component of the mixtures may be chosen based on desired dimensions and shapes of the nanosheets. In some embodiments, a process temperature of the wet operation 430 may be substantially in a range between about 20° C. and about 80° C.

The present disclosure provides embodiments of methods for manufacturing a semiconductor structure that provide one or more improvements over existing approaches. By cleaning the exposed surfaces of the nanosheets 432 and trimming the nanosheets 432 through the wet operation 430, the resulting multi-gate semiconductor structure 400 may provide improved performance due to less damage of the inner spacers 411 and the spacer 414. Furthermore, since the wet cleaning operation 430a and the wet oxidation operation 430b may be performed concurrently in a single chamber, the proposed method 100/200/300 provides benefits by increasing production efficiency and lowering associated costs.

Referring to FIGS. 14A and 14B, in some embodiments, one or more operations 434 may be performed to densify the IL 452. In some embodiments, the IL 452 is densified through an oxidation operation. The oxidation operation may include hydrogen peroxide or sulfuric acid, but the present disclosure is not limited thereto. Alternatively or additionally, the IL 452 is densified through an annealing operation. The annealing operation may include an inert gas annealing, but the present disclosure is not limited thereto. Alternatively or additionally, the IL 452 is densified through a cleaning operation. In some embodiments, the cleaning operation may include an APM mixture, an HPM mixture (a mixture of hydrochloric acid (HCl), hydrogen peroxide, and water) or ozone ($O_3$). The oxidation operation, annealing operation or the cleaning operation may be chosen based on desired properties of the IL 452.

Figure 15B:
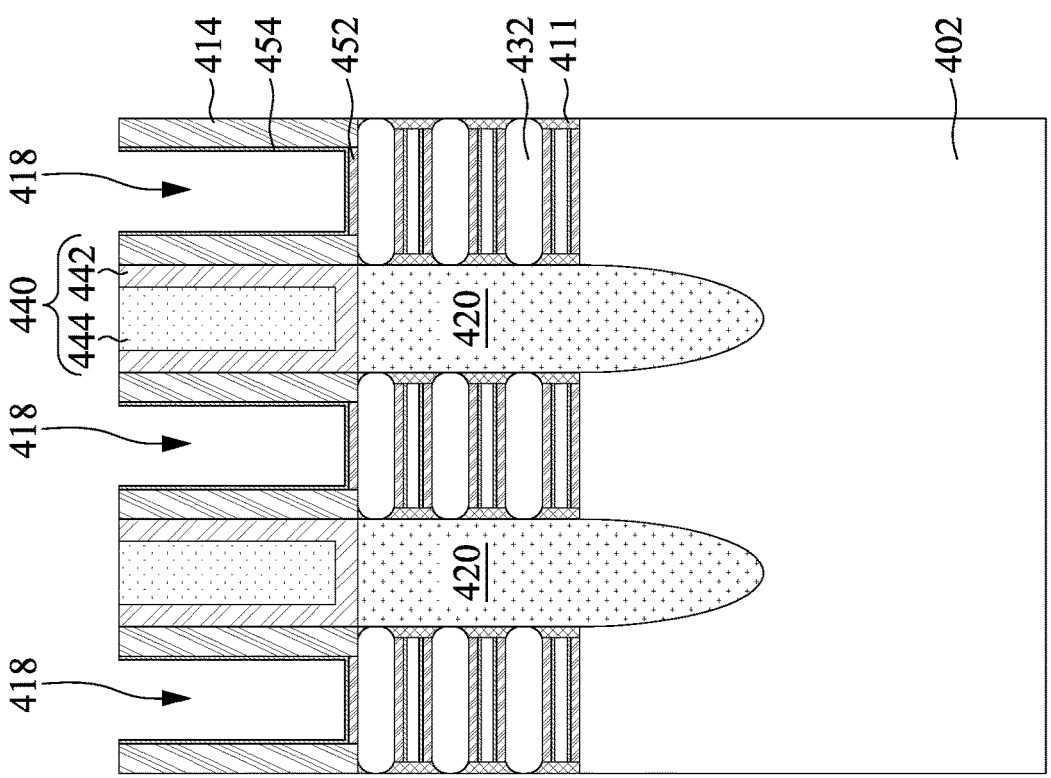

Referring to FIGS. 15A and 15B, in some embodiments, after the forming of the IL 452, a gate dielectric layer 454 is formed over the IL 452. In some embodiments, the gate dielectric layer 454 surrounds each of the nanosheets 432. In some embodiments, the gate dielectric layer 454 includes a high-k dielectric material having a high dielectric constant, for example, a dielectric constant greater than that of thermal silicon oxide (~3.9). The high-k dielectric material may include hafnium oxide (HfO$_2$), zirconium oxide (ZrO$_2$), lanthanum oxide (La$_2$O$_3$), aluminum oxide (Al$_2$O$_3$), titanium oxide (TiO$_2$), yttrium oxide (Y$_2$O$_3$), strontium titanate (SrTiO$_3$), hafnium oxynitride (HfO$_x$N$_y$), other suitable metal oxides, or combinations thereof.

Figure 16B:
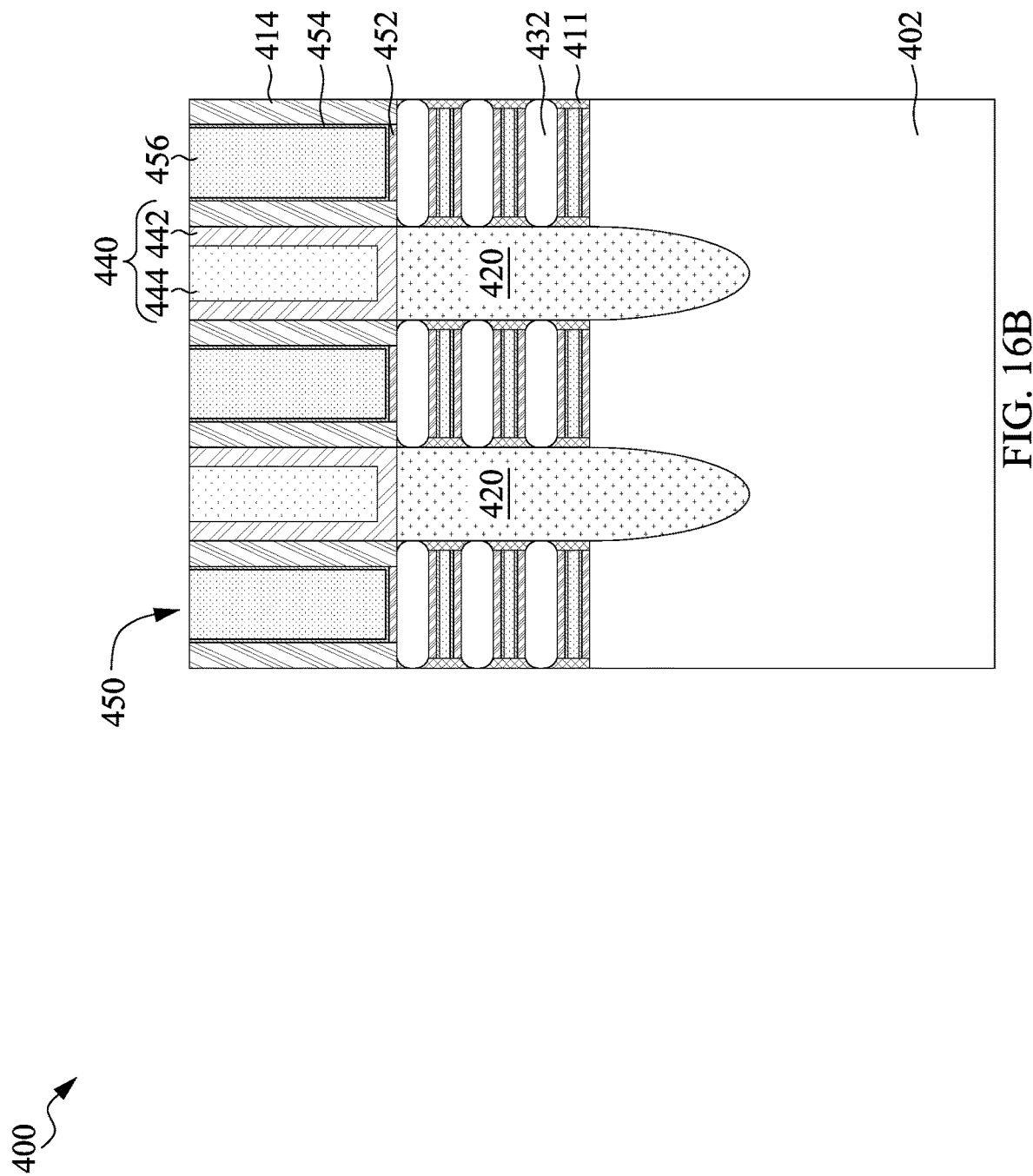

Referring to FIGS. 16A and 16B, in some embodiments, after the forming of the gate dielectric layer 454, a gate conductive layer 456 is disposed in the gate trench 418. The gate conductive layer 456 is formed on the gate dielectric layer 454. In some embodiments, the gate conductive layer 456 may be formed for an n-channel FET or a p-channel FET. In some embodiments, the gate conductive layer 456 may include at least a barrier metal layer (not shown), a work function layer (not shown) and a gap-filling metal layer (not shown). The barrier metal layer may include, for example but not limited thereto, TiN. The work function metal layer, which provides proper work function to the n-channel FET, includes one or more of TaN, TaAlC, TiN, TiC, Co, TiAl, HfTi, TiSi and TaSi, but the disclosure is not limited thereto. The work function metal layer, which provides proper work function to the p-channel FET, includes one or more of TiAlC, Al, TiAl, TaN, TaAlC, TiN, TiC and Co, but the disclosure is not limited thereto. The gap-filling metal layer is formed to fill the gate trench 418. The gap-filling metal layer may include conductive material, such as Al, Cu, AlCu, or W, but is not limited to the above-mentioned materials. Accordingly, a gate structure 450 is formed in the gate trench 418.

The present disclosure provides embodiments of methods for manufacturing a multi-gate semiconductor structure. By forming nanosheet structures through a wet operation, damage to sidewall spacers and/or inner spacers may be mitigated. Accordingly, stability and reliability of the multi-gate semiconductor structure are improved.

In accordance with some embodiments of the present disclosure, a method for forming a multi-gate semiconductor structure is provided. The method includes the following operations. A substrate including a fin structure is received. The fin structure includes a plurality of first semiconductor layers and a plurality of second semiconductor layers arranged alternating with the plurality of first semiconductor layers. A sacrificial gate structure is disposed over a portion of the fin structure. A dielectric structure is disposed over the substrate. A portion of the sacrificial gate structure is removed to form a gate trench in the dielectric structure. The plurality of second semiconductor layers exposed through the gate trench is removed. A wet operation is performed to trim a thickness of each of the plurality of first semiconductor layers and form a plurality of nanosheets in the gate trench.

In accordance with some embodiments of the present disclosure, a method for forming a multi-gate semiconductor structure is provided. The method includes the following operations. A substrate including a fin structure is received. First portions of the fin structure are removed to form a recess in the substrate. A plurality of inner spacers and a semiconductor layer are formed in the recess. A dielectric structure is disposed over the substrate. A gate trench is formed in the dielectric structure. Second portions of the fin structure exposed through the gate trench are removed. A plurality of nanosheets and an interfacial layer surrounding each of the plurality of nanosheets are formed through a wet operation.

In accordance with some embodiments of the present disclosure, a method for forming a multi-gate semiconductor structure is provided. The method includes the following operations. A substrate including a fin structure is received. First portions of the fin structure are removed to expose a source/drain region of the fin structure. A semiconductor layer is formed in the source/drain region. Second portions of the fin structure are removed to expose a channel region of the fin structure. A surface of the channel region of the fin structure is cleaned. An interfacial layer is formed over the cleaned surface of the channel region of the fin structure.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a multi-gate semiconductor structure, comprising:
    receiving a substrate comprising a fin structure, the fin structure comprising a plurality of first semiconductor layers and a plurality of second semiconductor layers arranged alternating with the plurality of first semiconductor layers;
    disposing a sacrificial gate structure over a portion of the fin structure;
    removing portions of the fin structure exposed through the sacrificial gate structure to form a recess in the substrate, wherein the first semiconductor layers and the second semiconductor layers are exposed through sidewalls of each recess;
    forming an inner spacer coupled to each second semiconductor layer exposed through the sidewalls of the recess;
    disposing a dielectric structure over the substrate;
    removing a portion of the sacrificial gate structure to form a gate trench in the dielectric structure;
    removing the plurality of second semiconductor layers exposed through the gate trench; and
    performing a wet operation to trim a thickness of each of the plurality of first semiconductor layers and form a plurality of nanosheets in the gate trench.

2. The method of claim 1, further comprising:
    forming an epitaxial layer in the recess.

3. The method of claim 1, wherein the wet operation further comprises:
    forming an interfacial layer surrounding each of the plurality of nanosheets in the gate trench.

4. The method of claim 3, wherein the interfacial layer includes an oxide-containing material.

5. The method of claim 3, further comprising:
    densifying the interfacial layer through an oxidation operation.

6. The method of claim 3, further comprising:
densifying the interfacial layer through an annealing operation.

7. The method of claim 3, further comprising:
forming a gate dielectric layer over the interfacial layer.

8. The method of claim 7, wherein the gate dielectric layer includes a high-k dielectric material.

9. The method of claim 7, further comprising:
forming a gate conductive layer over the gate dielectric layer.

10. The method of claim 1, wherein each of the second semiconductor layers is enclosed by the first semiconductor layers and the inner spacer.

11. A method for forming a multi-gate semiconductor structure, comprising:
receiving a substrate comprising a fin structure;
removing first portions of the fin structure to form a recess in the substrate;
forming a plurality of inner spacers and a semiconductor layer in the recess, wherein the inner spacers are in contact with the semiconductor layer;
disposing a dielectric structure over the substrate;
forming a gate trench in the dielectric structure;
removing second portions of the fin structure exposed through the gate trench; and
forming a plurality of nanosheets and an interfacial layer surrounding each of the plurality of nanosheets through a wet operation.

12. The method of claim 11, wherein the plurality of inner spacers remains substantially intact after the wet operation.

13. The method of claim 11, wherein the wet operation comprises:
forming the plurality of nanosheets through a wet cleaning operation; and
forming the interfacial layer surrounding each of the plurality of nanosheets through a wet oxidation operation.

14. The method of claim 13, wherein the wet cleaning operation comprises an isotropic wet etching.

15. The method of claim 14, wherein an end of each of the plurality of nanosheets is rounded after the wet cleaning operation.

16. The method of claim 11, wherein the semiconductor layer is formed to cover the plurality of inner spacers and a bottom of the recess.

17. The method of claim 11, wherein each of the plurality of inner spacers is formed between the second portions of the fin structure and the semiconductor layer prior to the removal of the second portions of the fin structure.

18. A method for forming a multi-gate semiconductor structure, comprising:
receiving a substrate comprising a fin structure;
removing first portions of the fin structure to expose a source/drain region of the fin structure;
forming an inner spacer in the source/drain region;
forming a semiconductor layer in the source/drain region, wherein the semiconductor layer is in contact with the inner spacer;
removing second portions of the fin structure to expose a channel region of the fin structure;
cleaning a surface of the channel region of the fin structure; and
forming an interfacial layer over the cleaned surface of the channel region of the fin structure.

19. The method of claim 18, further comprising:
performing a wet cleaning operation to clean the surface of the channel region of the fin structure, wherein the wet cleaning operation is configured to remove an oxidized component or a fluoride component of the fin structure prior to the formation of the interfacial layer.

20. The method of claim 19, wherein the oxidized component or the fluoride component of the fin structure is formed after the removal of the second portions of the fin structure.

* * * * *